(12) United States Patent
Minami et al.

(10) Patent No.: US 6,522,003 B1
(45) Date of Patent: Feb. 18, 2003

(54) SEMICONDUCTOR DEVICE AND METHOD OF MANUFACTURING THE SAME

(75) Inventors: Takayoshi Minami, Kanagawa (JP); Osamu Tsuboi, Kanagawa (JP); Toshimi Ikeda, Kanagawa (JP); Masato Matsumiya, Kanagawa (JP); Kuninori Kawabata, Kanagawa (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/472,833

(22) Filed: Dec. 28, 1999

(30) Foreign Application Priority Data

May 11, 1999 (JP) .......................................... 11-130614

(51) Int. Cl.[7] .............................................. H01L 23/48
(52) U.S. Cl. ...................... 257/758; 257/797; 257/750
(58) Field of Search ................................ 257/797, 750, 257/758

(56) References Cited

U.S. PATENT DOCUMENTS

| 5,243,220 A | * | 9/1993 | Shibata et al. | ............. 257/748 |
|---|---|---|---|---|
| 5,311,061 A | * | 5/1994 | Sheck | ......................... 257/797 |
| 5,530,280 A | * | 6/1996 | White | .......................... 257/508 |
| 5,640,049 A | * | 6/1997 | Rostoker et al. | ............. 257/758 |
| 5,640,053 A | * | 6/1997 | Caldwell | ..................... 257/797 |
| 5,869,906 A | * | 2/1999 | Narimatsu | ................... 257/797 |
| 6,198,149 B1 | * | 3/2001 | Ishigaki | ....................... 257/506 |

FOREIGN PATENT DOCUMENTS

JP          1-152644          6/1989

* cited by examiner

*Primary Examiner*—Jerome Jackson
*Assistant Examiner*—Lourdes Cruz
(74) *Attorney, Agent, or Firm*—Armstrong, Westerman & Hattori, LLP.

(57) ABSTRACT

A semiconductor device characterized by comprising a first insulating film formed on the semiconductor substrate, a first wiring or mark formed on the first insulating film, an electrically isolated pattern formed under the first insulating film and below the first wiring or mark, a hole formed in the first insulating film to connect the first wiring or mark and the electrically isolated pattern, and a second insulating film for covering the first wiring or mark.

9 Claims, 21 Drawing Sheets

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the same and, more particularly, a semi-conductor device having wirings formed on an interlayer insulating film and a method of manufacturing the same.

2. Description of the Prior Art

In addition to a demand for higher integration density, miniaturization of the device is also required in the recent semiconductor device to suppress increase in a chip area. In order to miniaturize the device, miniaturization of the resist pattern used as a patterning mask of the film is needed.

In order to miniaturize the resist pattern, some approaches are employed, e.g., the exposure light source of short wavelength is employed, the lens with large numerical aperture (NA) is employed, the ultra-resolution technology is employed, or the like.

The exposure method using the phase shift mask can be utilized as the ultra-resolution technology, but such exposure method can achieve the sufficient effect merely under the particular condition such that the modified illumination method is employed. In addition, production of the phase shift mask yields a higher cost of the device.

If the exposure light source of short wavelength is employed, not only the exposure system but also the lens, resist, etc. must be newly developed.

Accordingly, in order to miniaturize the semiconductor device, the method of improving the exposure resolution by using the lens with large numerical aperture is normally employed.

When the resist is exposed by the light, the resolution R can be given by $$R = \beta \lambda / NA \quad (1)$$

Where, in Eq.(1), NA is the numerical aperture of the lens, $\beta$ is a constant decided depending upon process, material, etc., and $\lambda$ is a wavelength of the exposure light source.

The depth of focus (DOF) which is important in the lithography technology using the light can be given by $$DOF = \pm \lambda / 2NA^2 \quad (2)$$

As evident from Eqs.(1) and (2), the lens with the larger numerical aperture brings about reduction in the depth of focus, and also the exposure light source of the shorter wavelength brings about reduction in the depth of focus.

While, since a width of the wiring is narrowed with the miniaturization of the semiconductor device, a film thickness of the wiring must be increased to suppress increase in the wiring resistance. In the DRAM, in order to keep the requisite capacitance of the cell capacitor at a predetermined value, the structure in which a height of the capacitor is increased is employed. In addition, the multi-layered wiring structure must be employed to miniaturize the semiconductor device, so that a total film thickness of the insulating films formed on the semiconductor substrate tends to increase.

As mentioned above, when the semiconductor device is miniaturized, films formed on the semiconductor substrate are thus made thicker and thus global difference in step of the chip tends to enlarge. As described above, this is contradictory to the reduction in the depth of focus when fine patterns are to be resolved.

Accordingly, in order to resolve fine patterns, an approach of reducing the global difference in step of the semiconductor device is needed.

In order to reduce the global difference in step, there is a method of planarizing the interlayer insulating film on the semiconductor substrate. There are two types of method, if roughly classified, as the planarizing method.

One method is that the insulating film formed $SiO_2$, BPSG(boro-phospho-silicate-glass), etc., the insulating film formed by using HDP (high-density-plasma), or the like is formed excessively thick on the semiconductor substrate and then such insulating film is polished.

The other method is that the insulating film is formed and then the reflow of such insulating film is caused by the thermal process to planarize.

In some cases, these two types of the planarizing process can be employed in combination.

In the case that such planarizing process of the insulating film is applied to the DRAM manufacturing steps, the insulating film is planarized and then bit lines, other wirings, other patterns, etc. are formed on the insulating film. Then, such bit lines, other wirings, other patterns, etc. are covered with the overlying insulating film.

However, when the overlying insulating film covering the wirings, other patterns, etc. is planarized by the heating, the underlying insulating film is also heated at the same time to thus reflow. Therefore, a part of the wirings and the alignment-associated marks are moved or shifted from their originally intended locations.

For example, in case the wirings are moved from the original locations, such problems are caused that, as shown in FIG. 1, the wiring 101 formed on the underlying insulating film 100 is displaced from the contact portion 102 prepared for another wiring formed on the wiring 101, or the wiring 101 and the contact hole 103 formed below the wiring 101 are short-circuited.

The above-mentioned movement of the wirings and the alignment marks may be considered because the non-uniform stress is applied between the wirings, the alignment marks and the insulating film.

Such movement of the wirings is ready to occur in the course wiring density area rather than the close wiring density area, and occurs more easily if the regularity of the wirings is lost.

In addition, the movement of the wirings is not caused in the area where the wiring is connected to the underlying wiring or the impurity diffusion region, but such movement of the wirings is caused in the area where the wiring is connected only to the overlying wiring. Especially a remarkable phenomenon is that, as shown in FIG. 1, the wiring is moved around a bent portion of the wiring 101 as an axis.

For example, such phenomenon can be illustrated by sectional shapes as follows.

First, as shown in FIG. 2A, a LOCOS film 112 is formed on a surface of a silicon substrate 110 except an impurity diffusion region 111, and then an underlying wiring 114 is formed on the LOCOS film 112. Then, a first interlayer insulating film 115 formed of BPSG so as to cover the impurity diffusion region 111, the LOCOS film 112, and the underlying wiring 114 is formed, and then a surface of the first interlayer insulating film 115 is planarized by the heating. Then, a first contact hole 116 and a second contact hole 117 are formed on the impurity diffusion region 111 and the underlying wiring 114 by etching a part of the first interlayer insulating film 115 respectively. Then, first to fourth overlying wirings 118 to 121 are formed on the first interlayer insulating film 115. The impurity diffusion region 111 is connected to the second overlying wiring 119 via the first contact hole 116, and a part of the underlying wiring 114 is connected to the third overlying wiring 120 via the second contact hole 117.

Thereafter, as shown in FIG. 2B, a second interlayer insulating film 122 covering the overlying wirings 118 to 121 is formed by the CVD method on the first interlayer insulating film 115. Subsequently, as shown in FIG. 2C, an upper surface of the second interlayer insulating film 122 is planarized by heating it to reflow. In this case, the first and fourth overlying wirings 118, 121, which are not connected to the underlying wiring or the impurity diffusion layer, out of the overlying wirings 118 to 121 formed below the second interlayer insulating film 122 are moved by the influences of the stress caused between the films, etc.

In FIGS. 2A to 2C, a reference 123 denotes a trench isolation formed in the silicon substrate 111.

In the prior art, in order to prevent such movement of the patterns such as wirings, alignment marks, etc., the design rule has been relaxed but the alignment accuracy has been made strict. However, with the request of miniaturization and higher integration density of the patterns in recent years, the movement of the patterns which are associated with the alignment cannot be disregarded even in the case that the alignment accuracy is made much more strict.

In this case, if the patterns associated with the alignment are moved, the alignment accuracy of the exposure mask employed in exposure is lowered and thus reduction in yield of the device is caused.

SUMMARY OF THE INVENTION

It is an object of the present invention to provide a semi-conductor device which is able to suppress movement of patterns put between insulating films, and a method of manufacturing the same.

According to the present invention, the wiring formed on the interlayer insulating film is connected to the electrically isolated pattern region via the underlying holes in the location where the wiring is not connected to the underlying wiring or the active region over the long distance, the location where the wiring is bent, the location where the wirings are formed coarsely, the location where the wiring is easily moved, or the like.

Therefore, if the overlying insulating film is formed on the wiring and then the reflow of the underlying insulating film is caused by heating at the time of reflow, the movement of the wiring can be suppressed by the isolated pattern region.

As a result, defective contact and short circuit between the wirings due to movement of the patterns can be prevented.

DETAILED DESCRIPTION OF THE PREFERRED EMBODIMENTS

Embodiments of the present invention will be explained in detail with reference to the accompanying drawings hereinafter.

(First Embodiment)

FIGS. 3A to 3F are sectional views showing steps of manufacturing a semiconductor device according to a first embodiment of the present invention.

Figure 1:
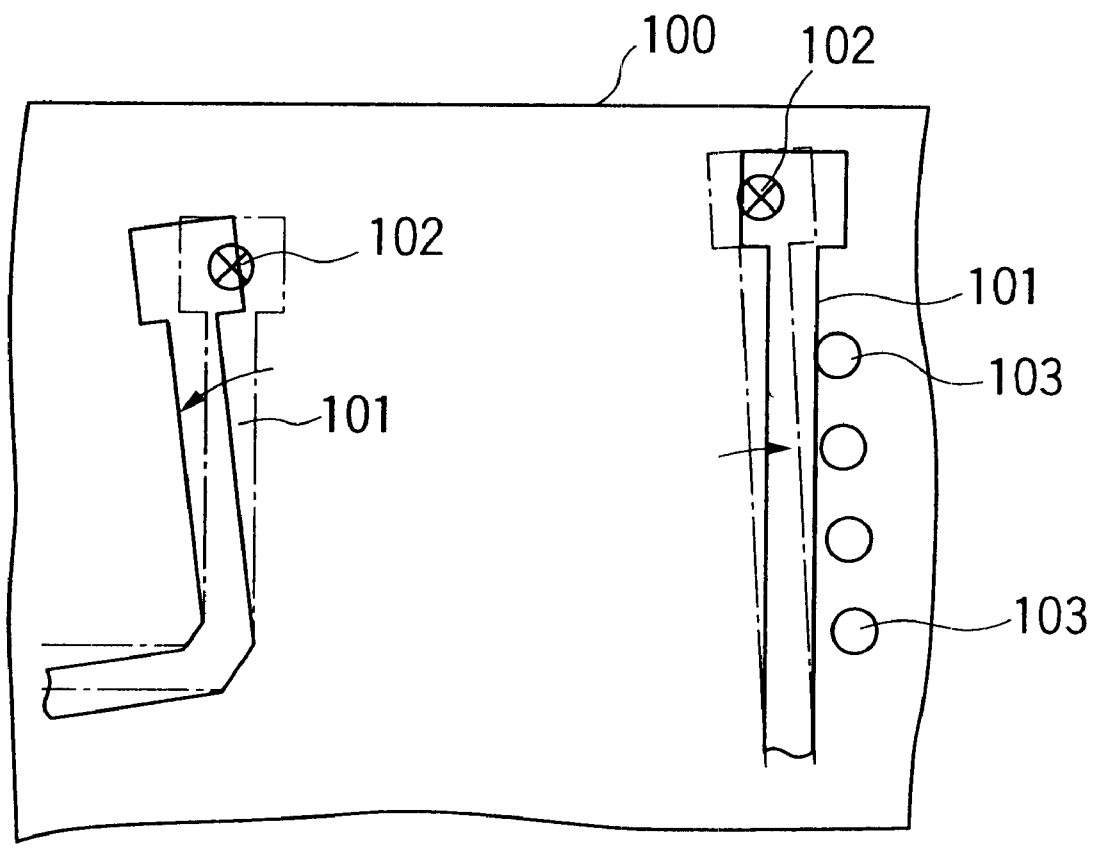
FIG. 1 is a plan view showing wirings in the prior art.
Figure 2A:
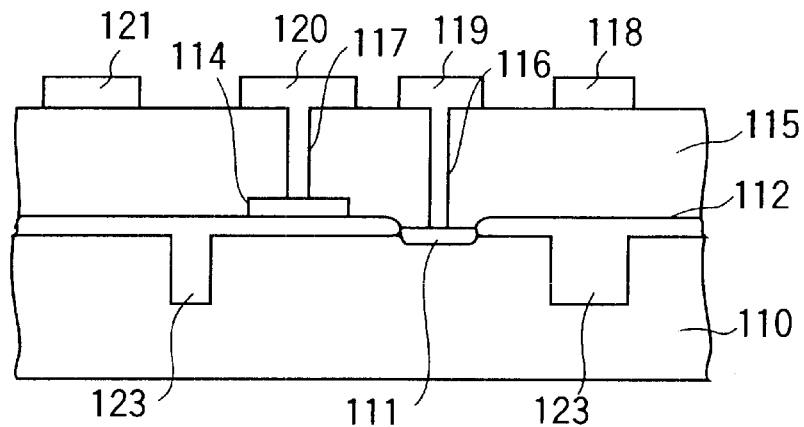
FIGS. 2 to 2C are sectional views showing steps of forming a multi-layered wiring structure in the prior art.
Figure 2B:
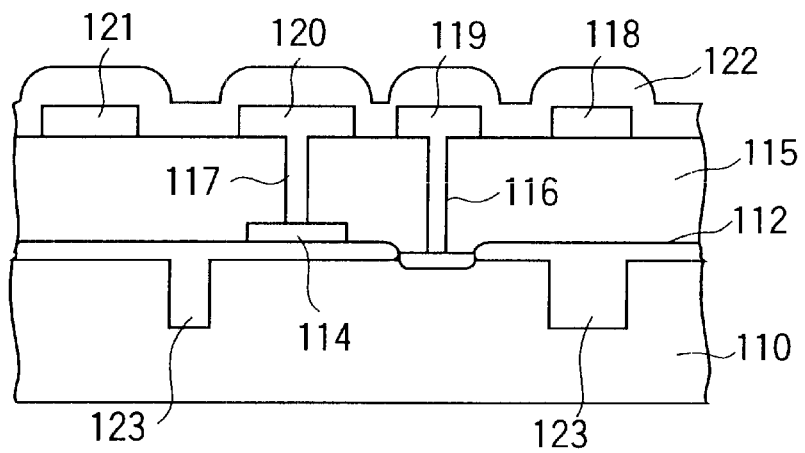
Figure 2C:
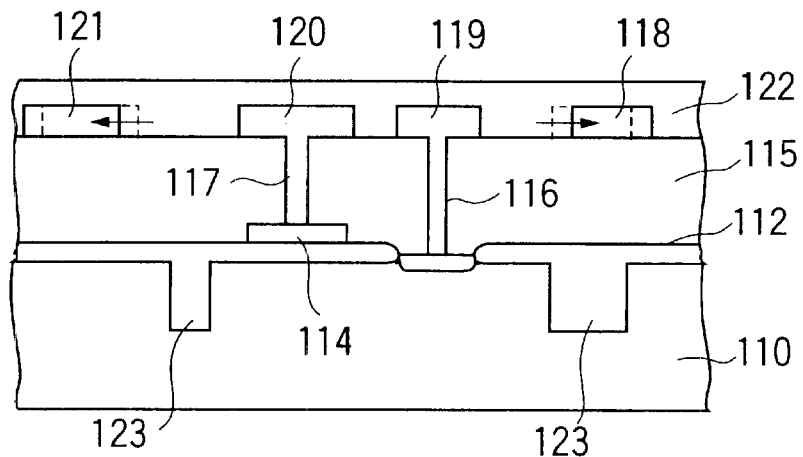
Figure 3A:
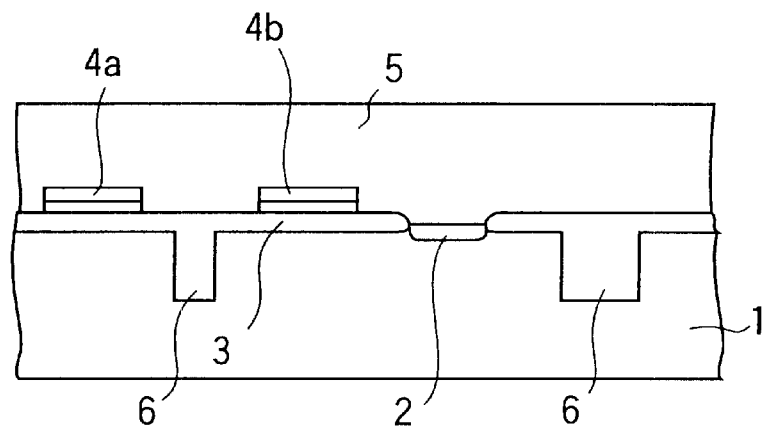
FIGS. 3A to 3F are sectional views showing steps of manufacturing a semiconductor device according to a first embodiment of the present invention.

First, as shown in FIG. 3A, a LOCOS (local oxidation of silicon) film 3 is formed on a surface of a silicon (semiconductor) substrate 1 other than an impurity diffusion region 2, and then a plurality of underlying wirings 4a, 4b passing on the LOCOS film 3 are formed. Such underlying wirings 4a, 4b may be formed by patterning a doped amorphous silicon film and then selectively growing tungsten suicide on the doped amorphous silicon film by the CVD method. Here, for example, the word lines are present as the underlying wirings 4a, 4b.

In turn, a first interlayer insulating film 5 formed of BPSG to cover the impurity diffusion region 2, the LOCOS film 3, and the underlying wirings 4a, 4b is formed to have a thickness of 700 nm. Then, the first interlayer insulating film 5 is heated at the temperature of about 750 to 900° C., e.g., 800° C., for 20 minutes to reflow. After this, with the use of the chemical mechanical polishing (CMP) method, a surface of the first interlayer insulating film 5 is polished by a thickness of about 200 nm to thus planarize.

Figure 3B:
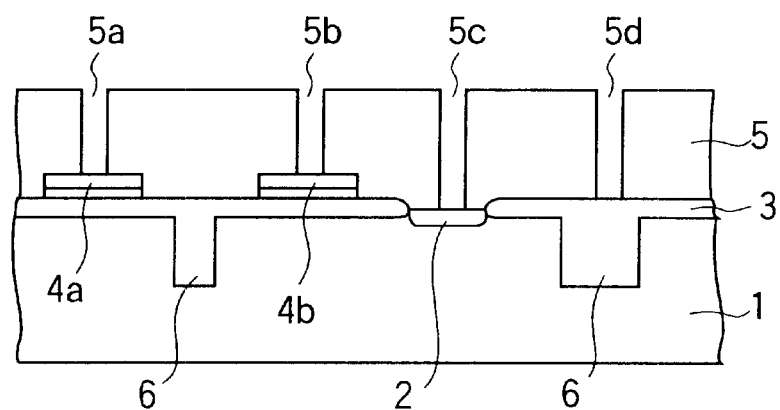

Next, as shown in FIG. 3B, a plurality of holes 5a to 5d are formed in the first interlayer insulating film 5 by the photolithography method. These holes 5a to 5d are formed on not only the impurity diffusion region 2, which is connected the bit line (overlying wiring) being formed on the first interlayer insulating film 5 by later steps, and a part of the underlying wiring 4b but also the underlying wiring 4a, which exists in the region being not the connection portion of the bit line, and the trench isolation 6.

Figure 3C:
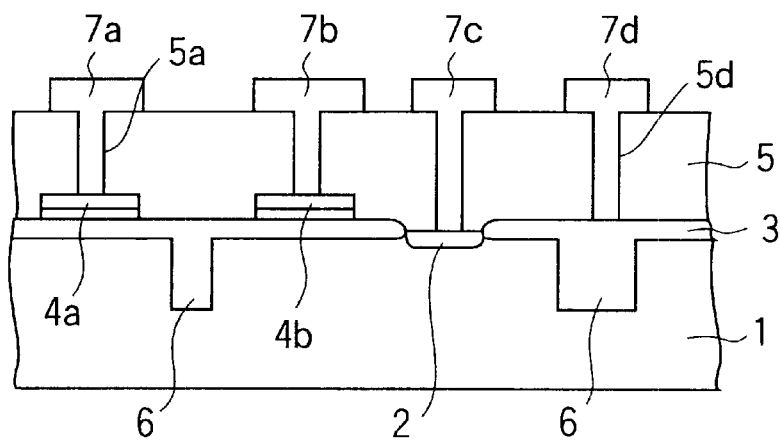

Then, a titanium (Ti) film of 20 nm thick, a titanium nitride (TiN) film of 50 nm thick, and a tungsten (W) film of 100 nm thick are formed in sequence on the first interlayer insulating film 5 and in the holes 5a to 5d, and then a silicon nitride film of 30 nm thick is formed by the plasma CVD method on the tungsten film as a reflection preventing film. Then, as shown in FIG. 3C, a plurality of bit lines 7a to 7d passing the holes 5a to 5d respectively are formed by patterning these films by using the photolithography method. In FIG. 3C, the first to fourth bit lines 7a to 7d are depicted.

Not only these bit lines 7a to 7d are connected to the impurity diffusion layer 2 and a part of the underlying wiring 4b via the holes 5b, 5c in the region where the electrical connection is requested, but also they are brought into contact with the underlying wiring 4a and the trench isolation 6 (or the LOCOS film 3) via the holes 5a, 5d which exist in the region where the stress is readily caused between the first interlayer insulating film 5 and them.

Figure 3D:
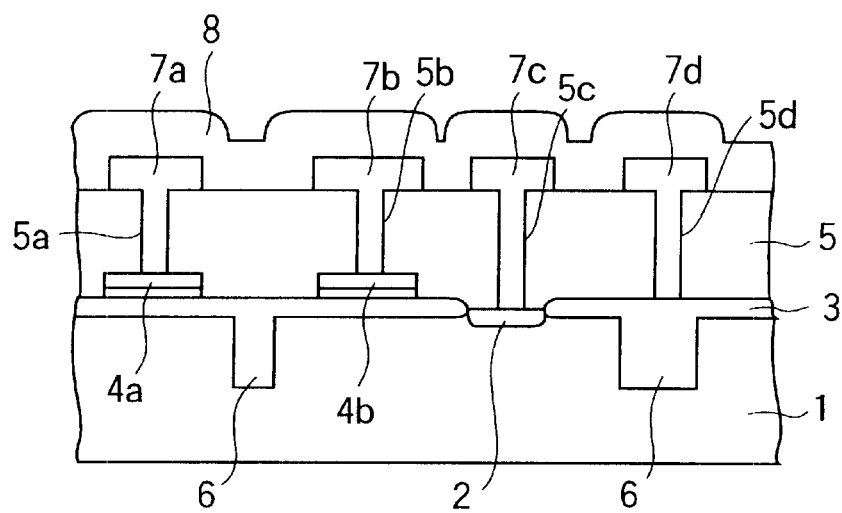
Figure 3E:
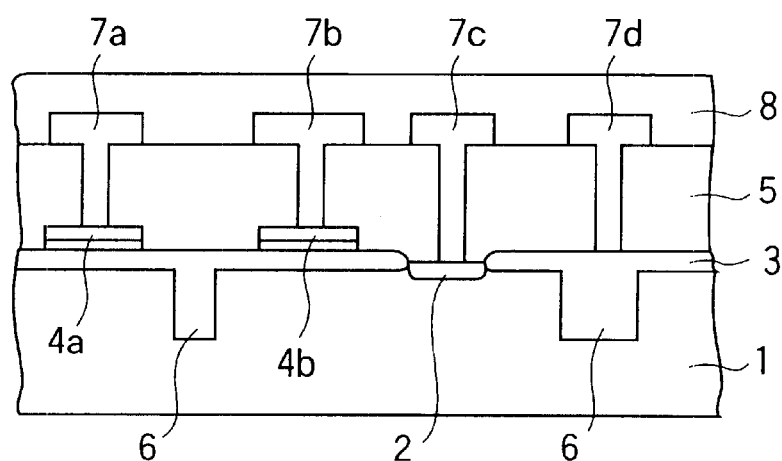

Next, as shown in FIG. 3D, a second interlayer insulating film 8, which is formed of BPSG to have a thickness of about 700 nm, is formed on the bit lines 7a to 7d and the first interlayer insulating film 5 by the CVD method. Then, as shown in FIG. 3E, the second interlayer insulating film 8 is heated at the temperature of about 750 to 900° C. (e.g., 800° C.) for 20 minutes to reflow.

At this time, the first interlayer insulating film 5 formed under the second interlayer insulating film 8 is also heated at the same time to reflow. However, since the first and fourth bit lines 7a, 7d which are easily affected by the stress and are not located essentially in the connection region are brought into contact with the underlying wiring 4b and the trench isolation 6 via the holes 5a, 5d formed under them, movement of the first interlayer insulating film 5 due to the reflow of the second interlayer insulating film 8 can be prevented. As a result, failures such as disconnection due to the first and fourth bit lines 7a, 7d, contact with the neighboring bit lines 7b, 7c, and defective connection with the wiring formed thereon can be prevented.

Figure 3F:
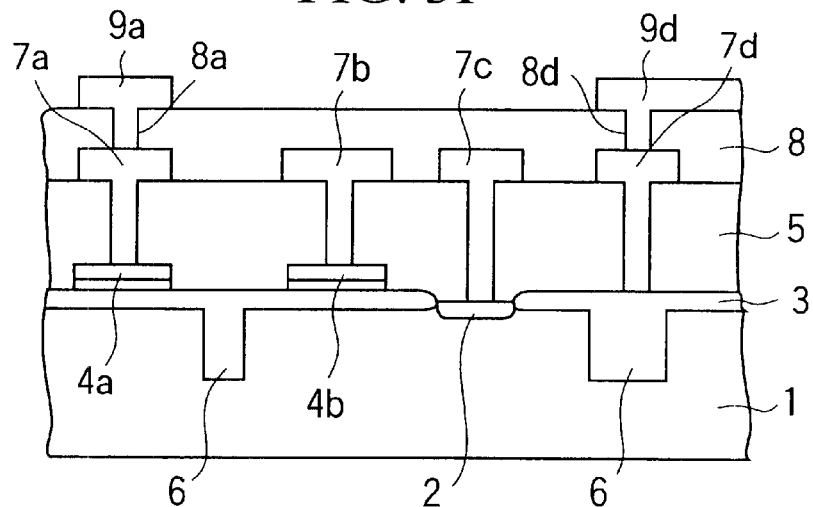

Accordingly, as shown in FIG. 3F, when third wirings 9a, 9d are formed on the second interlayer insulating film 8, such third wirings 9a, 9d can be connected to the underlying bit lines 7a, 7d without fail via contact holes 8a, 8d.

(Second Embodiment)

Figure 4:
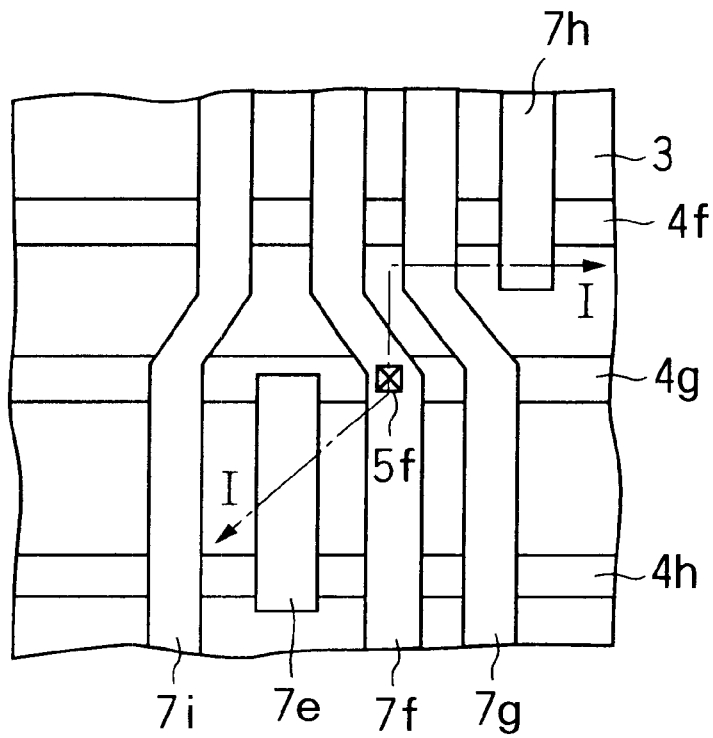
FIG. 4 is a plan view showing a relationship between word lines and bit lines in the prior art.
Figure 5:
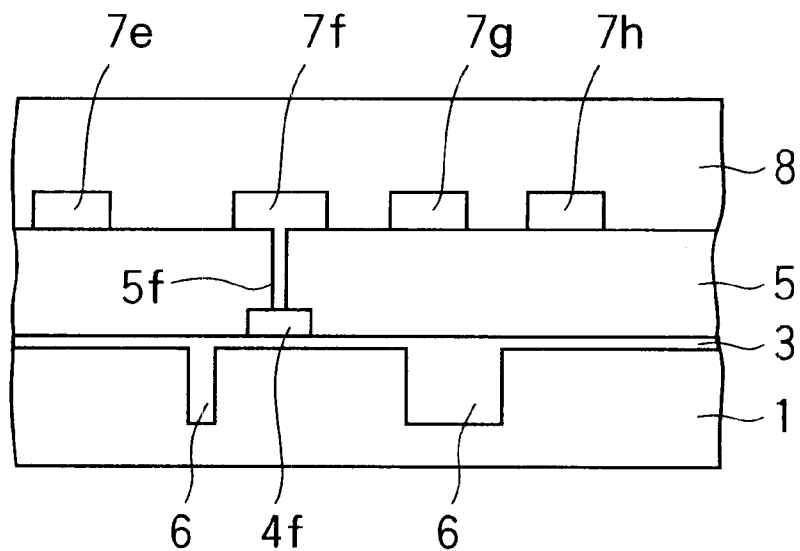
FIG. 5 is a sectional view showing a sectional structure taken along a line I—I in FIG. 4.

FIG. 4 is a plan view showing a positional relationship between word lines and bit lines in the peripheral circuit of DRAM in the prior art. FIG. 5 is a sectional view showing a sectional structure taken along a line I—I in FIG. 4. In FIG. 4, the interlayer insulating film is omitted.

As shown in FIGS. 4 and 5, in the prior art, the LOCOS film 3 is formed on the silicon substrate 1, then the trench isolation 6 is formed to the required minimum, and then the word line 4f and other wirings are formed on the LOCOS film 3. After this, the first interlayer insulating film 5 is formed on the silicon substrate 1, and then a plurality of bit lines 7e to 7h are formed on the first interlayer insulating film 5. Then, the hole 5f is formed in the first interlayer insulating film 5 in the region where the bit lines 7e to 7h are connected to the word line 4f, but no pattern made of conductive material or semiconductor is formed in the region where the bit lines 7e to 7h are not connected to the word line 4f. Also, the trench isolation 6 is not formed under the bit lines 7e to 7h.

Therefore, as shown in the first embodiment, if the holes are formed in the first interlayer insulating film 5 in order to prevent the movement of the bit lines 7e to 7h due to the stress caused when the second interlayer insulating film 8 covering the bit lines 7e to 7h is heated, there is a possibility that such holes are also formed in the LOCOS film 3 to reach the silicon substrate 1.

Therefore, in the second embodiment, such a structure is adopted that isolated dummy patterns or isolated dummy trench isolations are formed in the region where the word lines and the trench isolations are not originally required and then the holes are formed thereon to prevent the movement of the bit lines.

Figure 6:
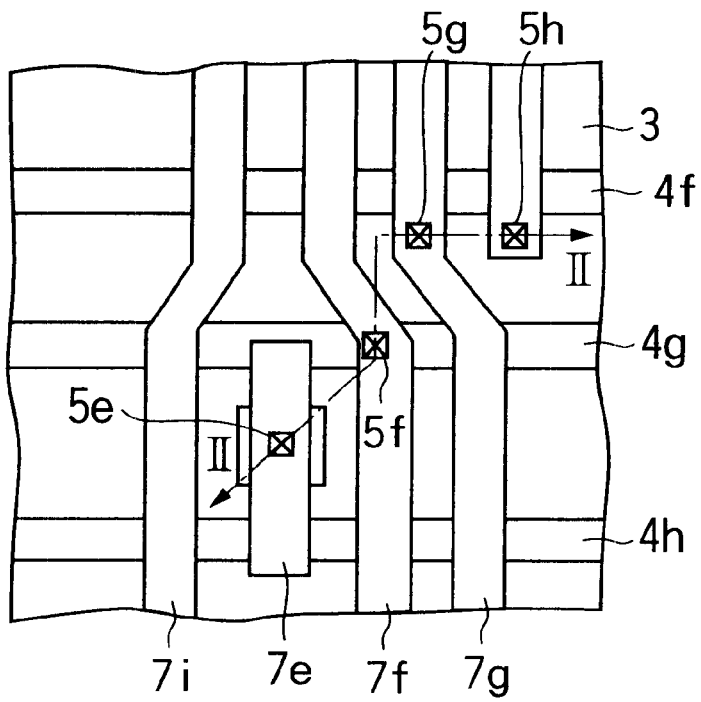
FIG. 6 is a plan view showing a relationship between word lines and bit lines according to a second embodiment of the present invention.
Figure 7:
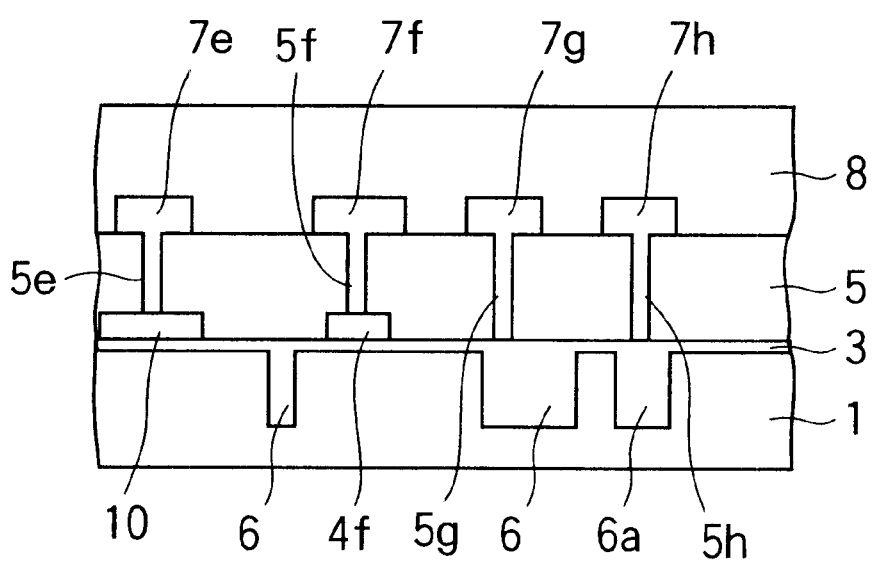
FIG. 7 is a sectional view showing a sectional structure taken along a line II—II in FIG. 6.

FIG. 6 is a plan view showing a positional relationship between the word lines and the bit lines in the peripheral circuit of DRAM, according to a second embodiment of the present invention. FIG. 7 is a sectional view showing a sectional structure taken along a line II—II in FIG. 6. In this case, the interlayer insulating film is omitted.

In FIGS. 6 and 7, a dummy pattern 10 as well as the word line 4e is formed on the LOCOS film 3 on the surface of the silicon substrate 1 to prevent the movement of the bit line 7e to 7h. The dummy pattern 10 can be formed by patterning a conductive film serving as the word line 4e so as to have the same layer structure as the word line 4e.

In addition, a first trench isolation 6 is formed in the device isolation region, and a second trench isolation 6a as a dummy trench isolation is formed in the region wherein the movement of a part of the bit line 7h is to be prevented. The dummy pattern 10 and the second trench isolation 6a are formed isolatedly not to be connected to other patterns.

Then, the first interlayer insulating film 5 made of BPSG is formed on the word line 4e, the LOCOS film 3, the dummy pattern 10 and the second trench isolations 6, 6a. The upper surface of the first interlayer insulating film 5 is planarized by heating and polishing.

A plurality of bit lines 7e to 7h are formed on the first interlayer insulating film 5. A part of the first bit line 7e out of the bit lines 7e to 7h is connected to the dummy pattern 10 via the first hole 5e formed in the first interlayer insulating film 5. A part of the second bit line 7f is connected to the word line 4f via the second hole 5f formed in the first interlayer insulating film 5. In addition, the third and fourth bit lines 7g, 7h are connected to the first and second trench isolations 6, 6a via the third and fourth holes 5g, 5h formed in the first interlayer insulating film 5 respectively.

Further, the first to fourth bit lines 7e to 7h are covered with the second interlayer insulating film 8 made of BPSG. The upper surface of the second interlayer insulating film 8 is planarized by virtue of reflow conducted by the heating. The reflow of the first interlayer insulating film 5 is caused at the time of heating. However, since movable portions of the bit lines 7e to 7h on the first interlayer insulating film 5 are connected to the dummy pattern 10 and the first and second trench isolations 6, 6a via the holes, they are brought into the situation to prevent the movement due to the reflow.

In this case, the alignment margin must be kept in the dummy pattern 10 and the dummy trench isolation 6a to meet the design rule.

While, in order to prevent the movement of the wirings during the manufacturing steps of the multi-layered wiring structure, normally following steps are adopted.

Figure 8A:
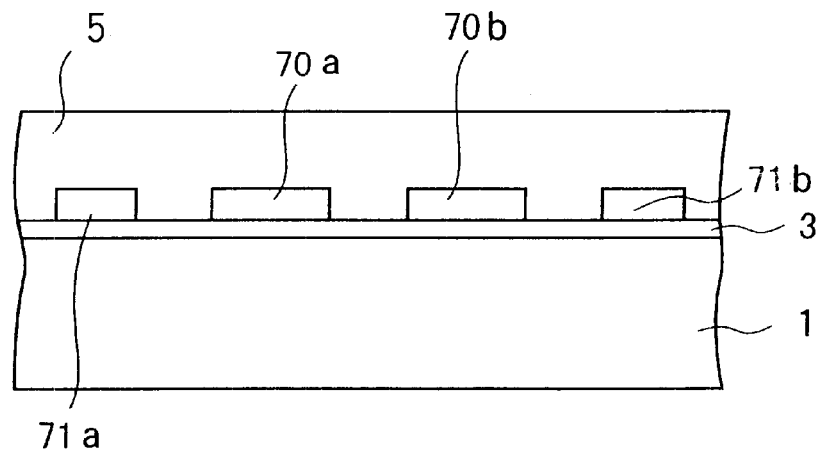
FIGS. 8A to 8E are sectional views showing the steps of forming a first layer wiring and a second layer wiring according to the second embodiment of the present invention.

First, as shown in FIG. 8A, the LOCOS film 3 is formed on the surface of the silicon substrate 1, and then first layer wirings 70a, 70b are formed on the LOCOS film 3 and also dummy patterns 71a, 71b are formed in the region wherein no first layer wirings 70a, 70b is present.

The first layer wirings 70a, 70b and the dummy patterns 71a, 71b are formed respectively, for example, by patterning a doped amorphous silicon film and then selectively growing tungsten silicide thereon by virtue of the CVD method.

Then, the first interlayer insulating film 5 made of BPSG is formed on the first layer wirings 70a, 70b, the dummy patterns 71a, 71b, and the LOCOS film 3 by the CVD method to have a thickness of 700 nm. Then, the first interlayer insulating film 5 is heated at the temperature of about 750 to 900° C., e.g., 800° C., for 20 minutes to reflow. Then, the surface of the first interlayer insulating film 5 is polished by a thickness of about 200 nm by the chemical mechanical polishing (CMP) method to planarize.

Figure 8B:
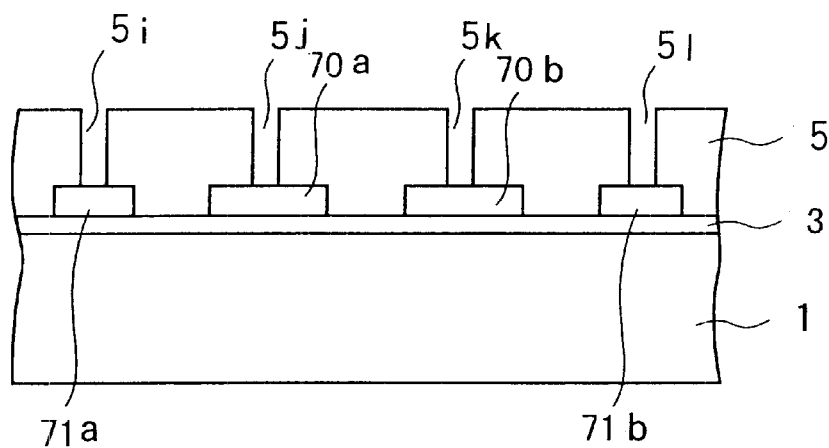

Then, as shown in FIG. 8B, a plurality of holes 5i to 5l are formed in the first interlayer insulating film 5 by the photolithography method. These holes 5i to 5l are formed on the dummy patterns 71a, 71b and the first layer wirings 70a, 70b.

Figure 8C:
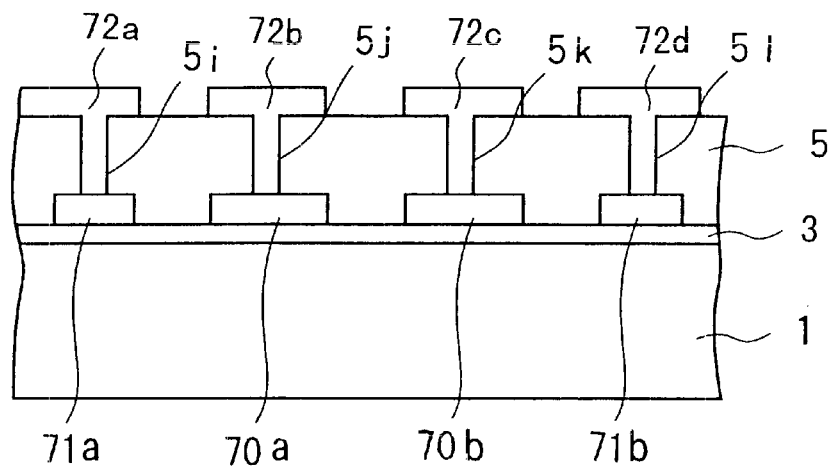

In addition, a titanium (Ti) film of 20 nm thick, a titanium nitride (TiN) film of 50 nm thick, and a tungsten (W) film of 100 nm thick are formed sequentially on the first interlayer insulating film 5 and in the holes 5i to 5l. Then, a silicon nitride film of 30 nm thick is formed on the tungsten film by the plasma CVD method as the reflection preventing film. Then, resist is coated on the reflection preventing film and then exposed and developed. Then, as shown in FIG. 8C, a plurality of second layer wirings 72a to 72d are formed to pass through the holes 5i to 5l by patterning these metal films while using the resist as a mask.

A part of the second layer wirings 72b, 72c are connected to the underlying first layer wirings 70a, 70b via the holes 5j, 5k. The remaining second layer wirings 72a, 72d are connected to the dummy patterns 71a, 71b via the holes 5i, 5l.

Figure 8D:
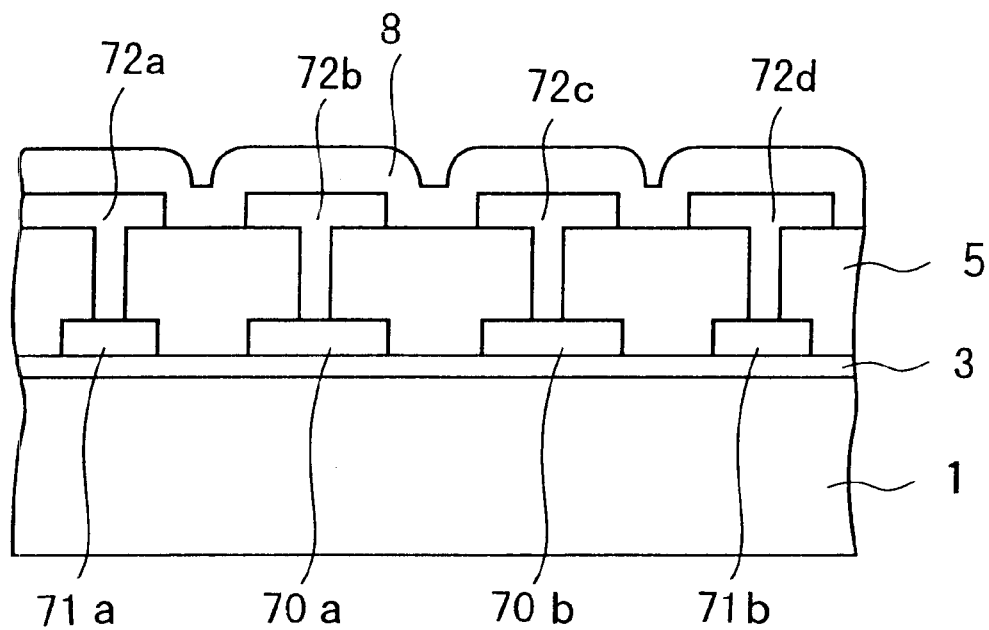
Figure 8E:
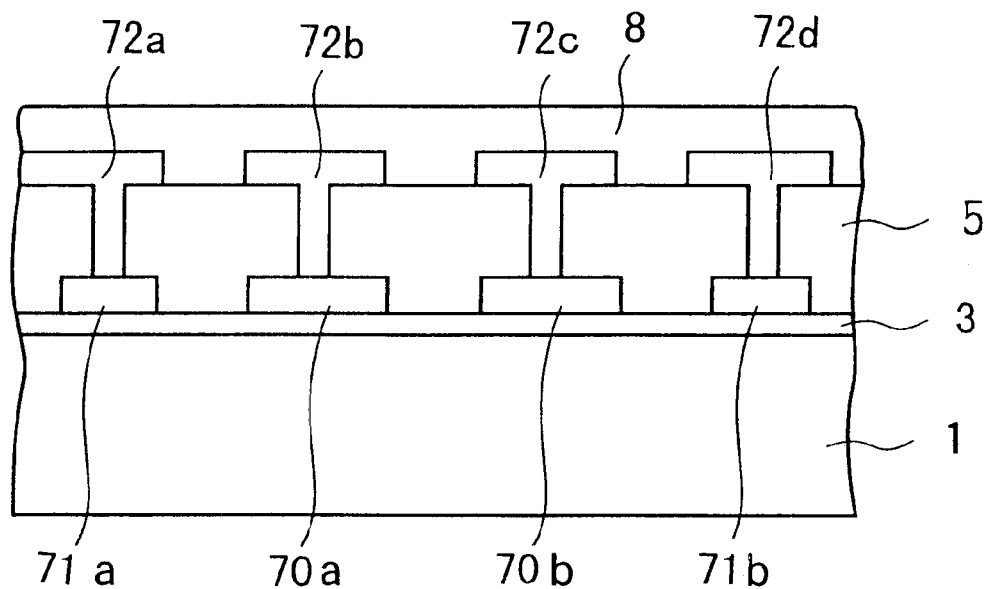

Then, as shown in FIG. 8D, the second interlayer insulating film 8 made of BPSG is formed on the second layer wirings 72a to 72d and the first interlayer insulating film 5 to have a thickness of 700 nm. Then, as shown in FIG. 8E, the second interlayer insulating film 8 is heated at the temperature of about 750 to 900° C., e.g., 800° C., for 20 minutes to reflow, whereby the upper surface of the second interlayer insulating film 8 is planarized. The reflow of the first interlayer insulating film 5 is caused by this heating. At that time, movement of the second layer wirings 72a to 72d due to the reflow can be prevented in not only the region in which the second layer wirings 72a to 72d are connected originally to the first layer wirings 70a, 70b but also the region in which they are easily moved since the second layer wirings 72a to 72d are also connected to the electrically isolated dummy patterns 71a, 71b via the holes 5i to 5l.

Like the above, in the multi-layered wiring structure, since the connection between the overlying wiring and the underlying wiring can be maintained good even if reflow of the interlayer insulating film is caused, the wirings can be connected without fail in the case that the number of wiring layers is increased.

(Third Embodiment)

When a course area and a close area of wirings formed on the first-layer interlayer insulating film are compared with each other, the wirings are easily moved in the course area of wirings when the second-layer interlayer insulating film is heated.

Figure 9:
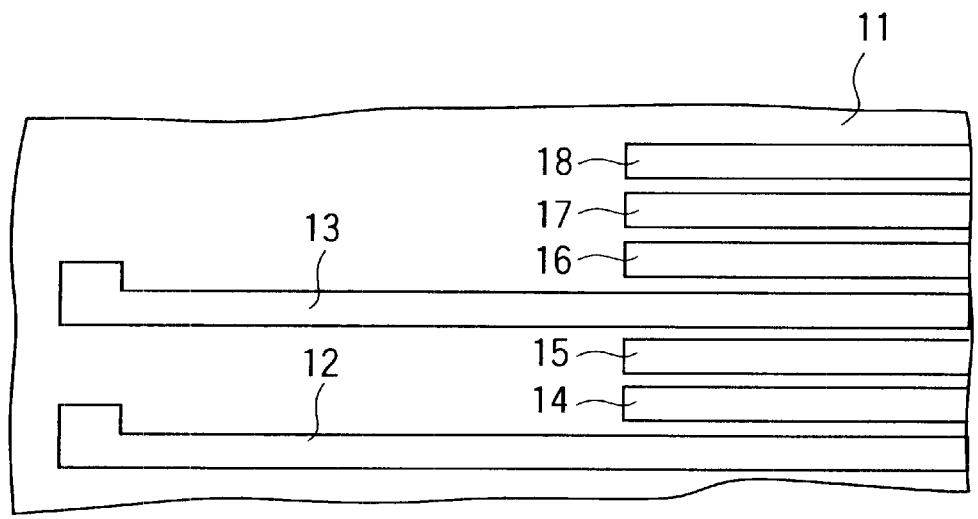
FIG. 9 is a plan view showing the second layer wiring of a semiconductor device in the prior art.

For example, in FIG. 9, when the reflow of the first-layer interlayer insulating film 11 is caused, wirings 12, 13 whose one ends are connected to the overlying wiring in the low density wiring region A are ready to move rather than wirings 14 to 18 which are formed in the high density wiring region B.

Figure 10:
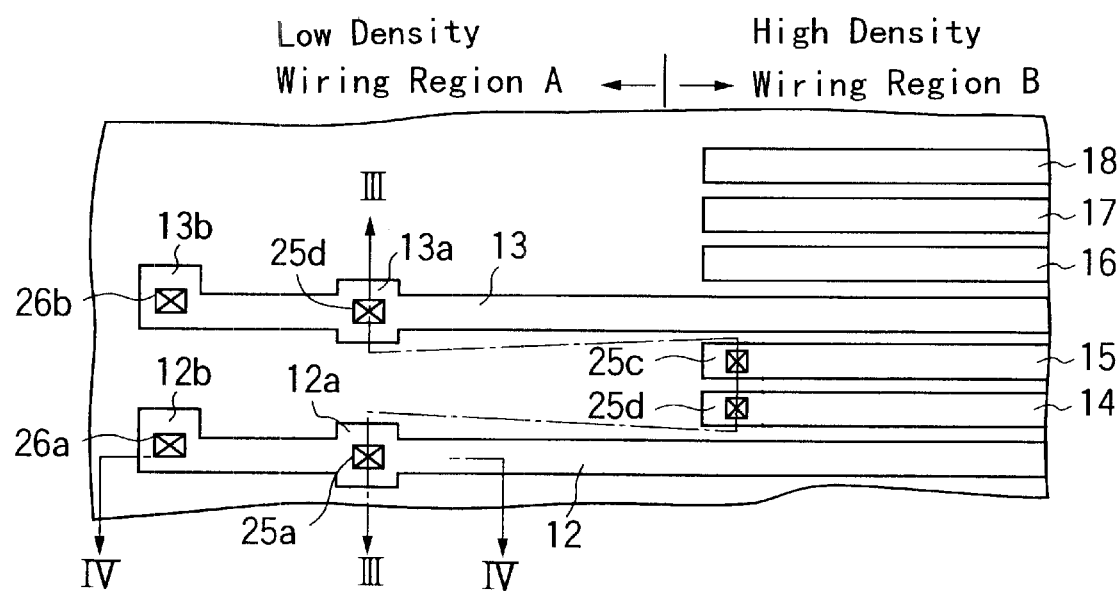
FIG. 10 is a plan view showing the second layer wiring of a semiconductor device according to a third embodiment of the present invention.

Therefore, in the third embodiment, as shown in FIG. 10, in order to prevent the movement of the wirings 12, 13 in the low density wiring region A, such a structure is adopted that wide contact portions 12a, 13a are formed in a part of these wirings 12, 13 in the low density wiring region A and the wirings 12, 13 are connected to the underlying dummy patterns.

Therefore, steps of connecting the wirings 12, 13 to the dummy patterns will be explained with reference to FIGS. 11A to 11E and FIGS. 12A to 12D hereinbelow. FIGS. 11A to 11E are sectional views showing the steps of manufacturing the semiconductor device according to the third embodiment of the present invention, taken along a line III—III in FIG. 10. FIGS. 12A and 12D are sectional views showing the steps of manufacturing the semiconductor device according to the third embodiment of the present invention, taken along a line IV—IV in FIG. 10.

Figure 11A:
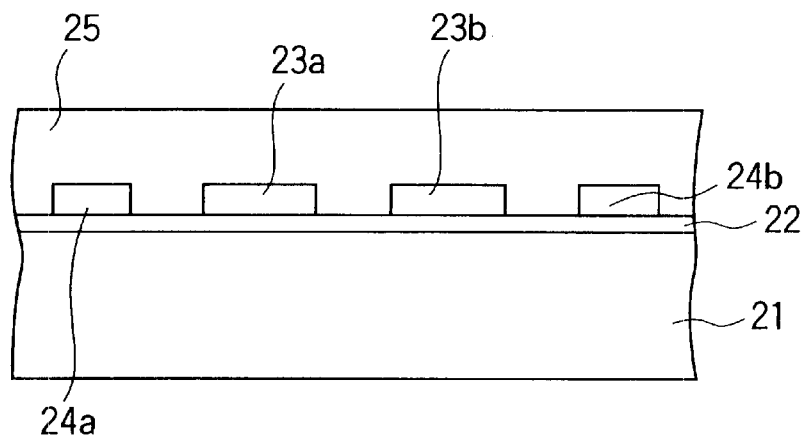
FIGS 11A to 11E are sectional views showing the steps of manufacturing the semiconductor device according to the third embodiment of the present invention, taken along a line III—III in FIG. 10.
Figure 12A:
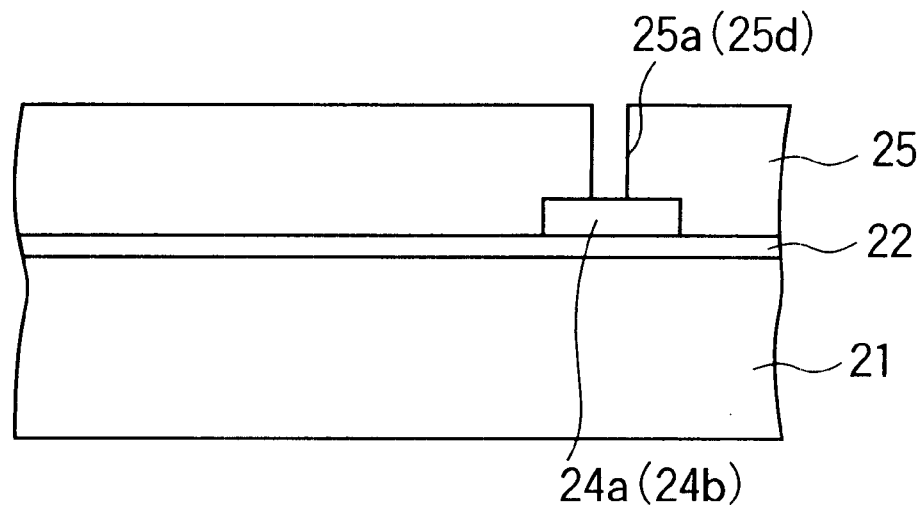
FIGS. 12A and 12D are sectional views showing the steps of manufacturing the semiconductor device according to the third embodiment of the present invention, taken along a line IV—IV in FIG. 10.

First, as shown in FIG. 11A, a LOCOS film 22 is formed on a surface of a silicon substrate 21, and then first-layer wirings 23a, 23b are formed on the LOCOS film 22 and also dummy patterns 24a, 24b are formed. Such first-layer wirings 23a, 23b and dummy patterns 24a, 24b may be formed respectively by patterning the doped amorphous silicon film and then selectively growing tungsten silicide on the doped amorphous silicon film by the CVD method. The dummy patterns 24a, 24b are arranged below the wiring forming region in the low density wiring region A.

In turn, a first interlayer insulating film 25 made of BPSG is formed on the first-layer wirings 23a, 23b, the dummy patterns 24a, 24b, and the LOCOS film 22 by the CVD method to have a thickness of 700 nm. Then, the first interlayer insulating film 25 is heated at the temperature of about 750 to 900° C., e.g., 800° C., for 20 minutes to reflow. After this, with the use of the chemical mechanical polishing (CMP) method, a surface of the first interlayer insulating film 25 is polished by a thickness of about 200 nm to thus planarize.

Figure 11B:
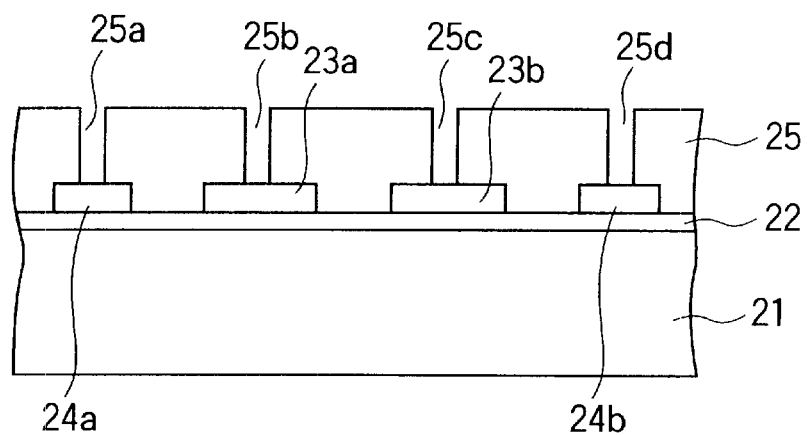

In the next, as shown in FIGS. 11B and 12A, a plurality of holes 25a to 25d are formed in the first interlayer insulating film 25 by the photolithography method. These holes 25a to 25d are formed on the first-layer wirings 23a, 23b and the dummy patterns 24a, 24b.

Figure 11C:
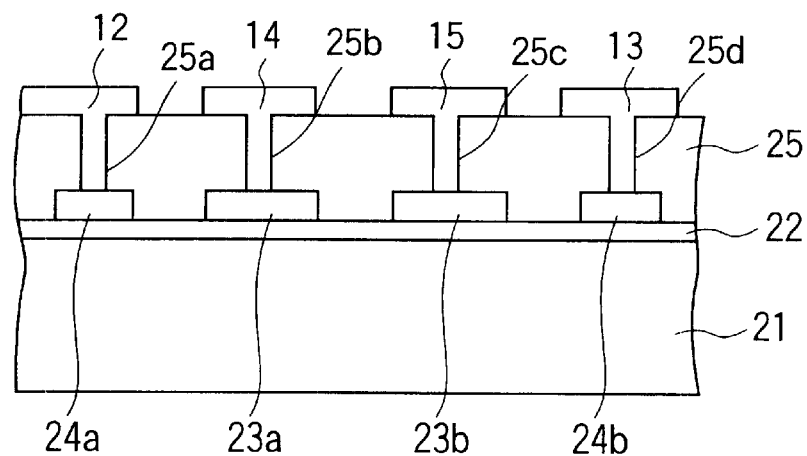

Then, a titanium (Ti) film of 20 nm thick, a titanium nitride (TiN) film of 50 nm thick, and a tungsten (W) film of 100 nm thick are formed in sequence on the first interlayer insulating film 25 and in the holes 25a to 25d. Then, a silicon nitride film of 30 nm thick is formed by the plasma CVD method on the tungsten film as the reflection preventing film. Then, resist is coated on the reflection preventing film and then exposed and developed. Then, as shown in FIG. 11C, a plurality of wirings 12 to 18 passing the holes 25a to 25d are formed by patterning these metal films while using the resist as a mask.

These wirings 12 to 18 have a planar shape as shown in FIG. 10. In other words, wide first contact portions 12a, 13a are formed at top portions of the first and second wirings 12, 13 extending to the low density wiring region A, and wide second contact portions 12b, 13b are formed in the middle portions of the first and second wirings 12, 13. The wide second contact portions 12b, 13b are connected to underlying dummy patterns 24a, 24b via holes 25a, 25d. Also, in the high density wiring region B, the third and fourth wirings 14, 15 are connected to the first-layer wirings 23a, 23b via holes 25b, 25c.

Figure 11D:
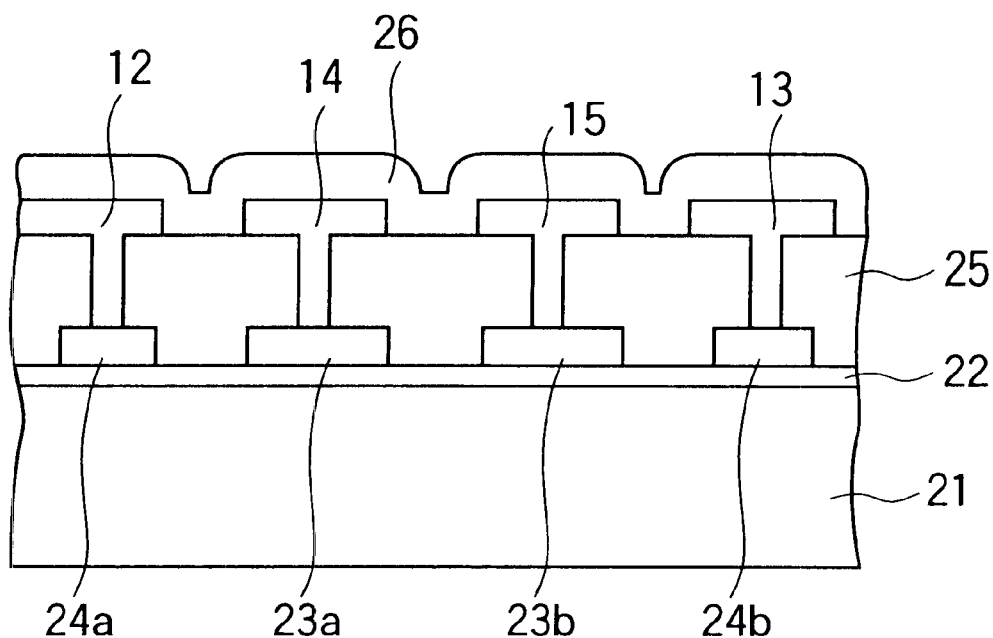
Figure 11E:
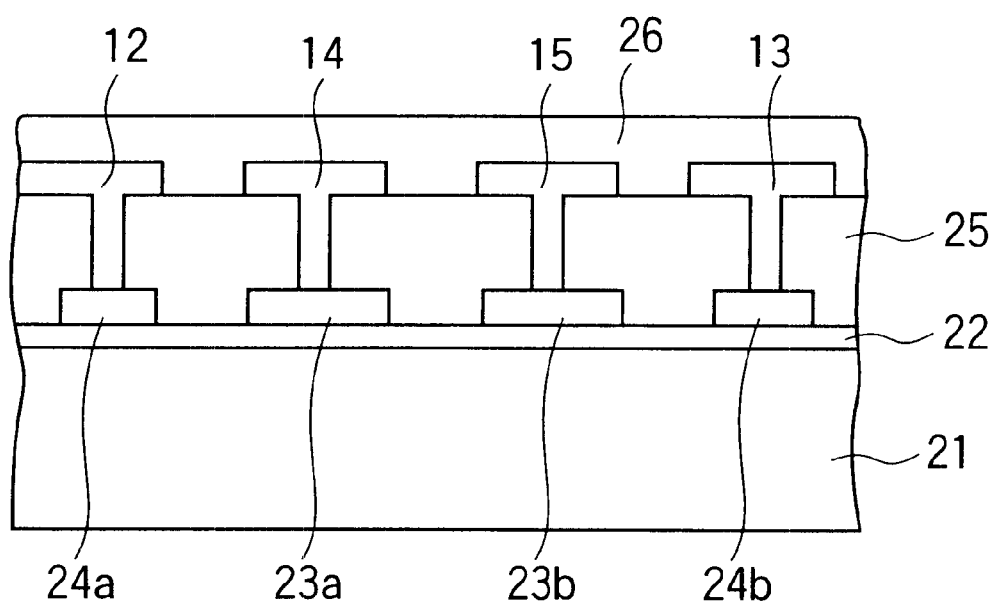
Figure 12B:
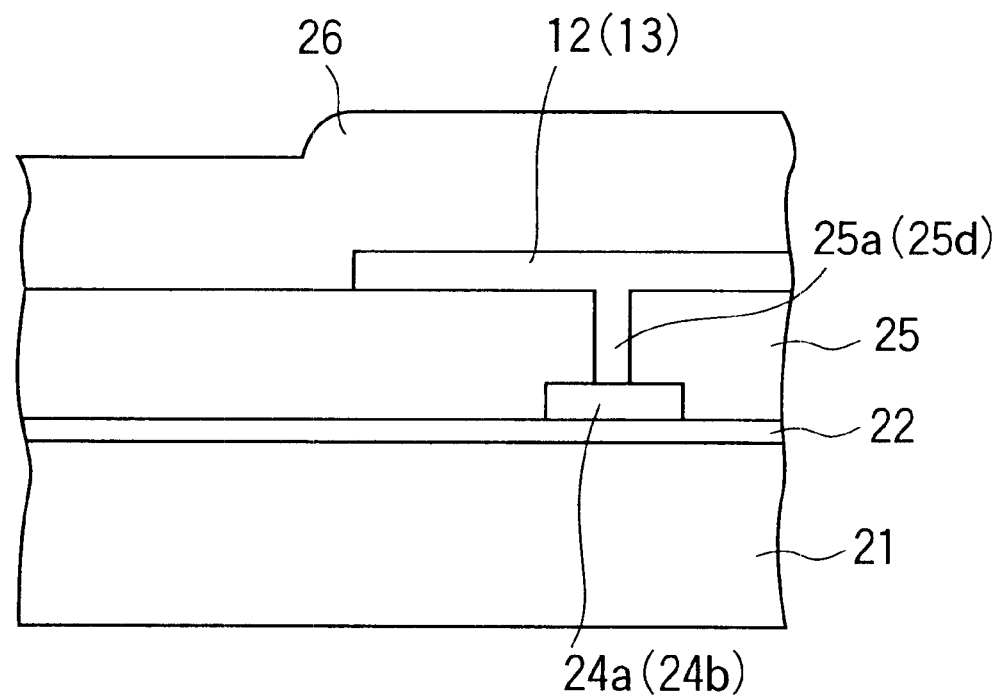
Figure 12C:
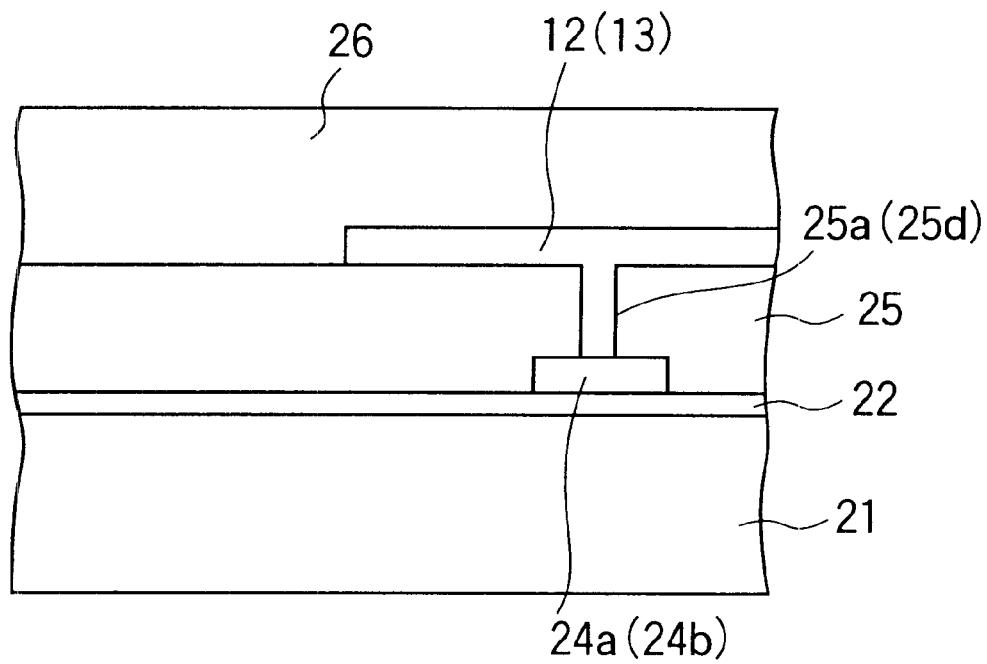
Figure 12D:
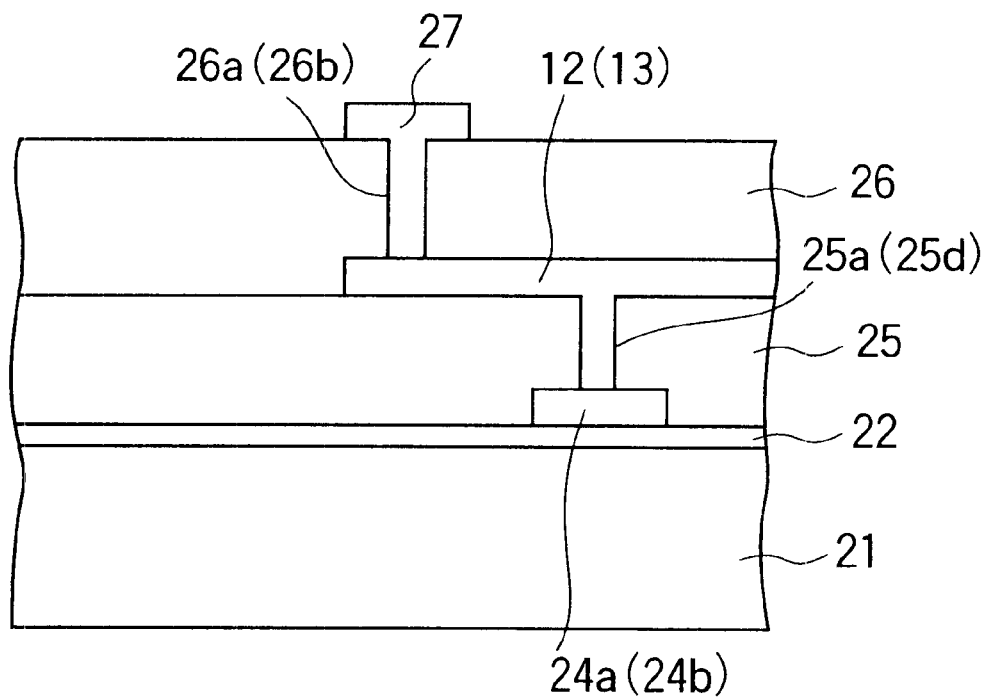

Next, as shown in FIGS. 11D and 12B, a second interlayer insulating film 26, which is formed of BPSG to have a thickness of 700 nm, is formed on the second-layer wirings 12 to 18 and the first interlayer insulating film 25. Then, as shown in FIGS. 11E and 12C, the second interlayer insulating film 26 is heated at the temperature of about 750 to 900° C., e.g., 800° C. for 20 minutes to reflow, whereby the upper surface of the second interlayer insulating film 26 is planarized. Although the reflow of the first interlayer insulating film 25 is caused by this heating, the movement of the first interlayer insulating film 25 can be suppressed because the first and second wirings 12, 13 provided in the low density wiring region A are connected to the dummy patterns 24a, 24b via the holes 25a, 25b in the second contact portions 12b, 13b.

Then, as shown in FIG. 12D, contact holes 26a, 26b are formed on the contact portions 12a, 13a at the top end portions of the first and second wirings 12, 13 which exist in the low density wiring region A. Then, if a third-layer wiring 27 passing though the contact holes 26a, 26b is formed on the second interlayer insulating film 26, the third-layer wiring 27 and the contact portions 12a, 13a formed at the top end portions of the first and second wirings 12, 13 are connected via the holes 26a, 26b.

As mentioned above, since the movement of the first and second second-layer wirings 12, 13 which are employed to provide the wirings according to later steps can be prevented, connection positions of the second-layer wirings 12, 13 and the third-layer wiring 27 are not largely displaced. As a result, good connection between the second-layer wirings 12, 13 and the third-layer wiring 27 can be attained.

In this while, the course area of wirings and the close area of wirings will be discriminated as follows.

Figure 13:
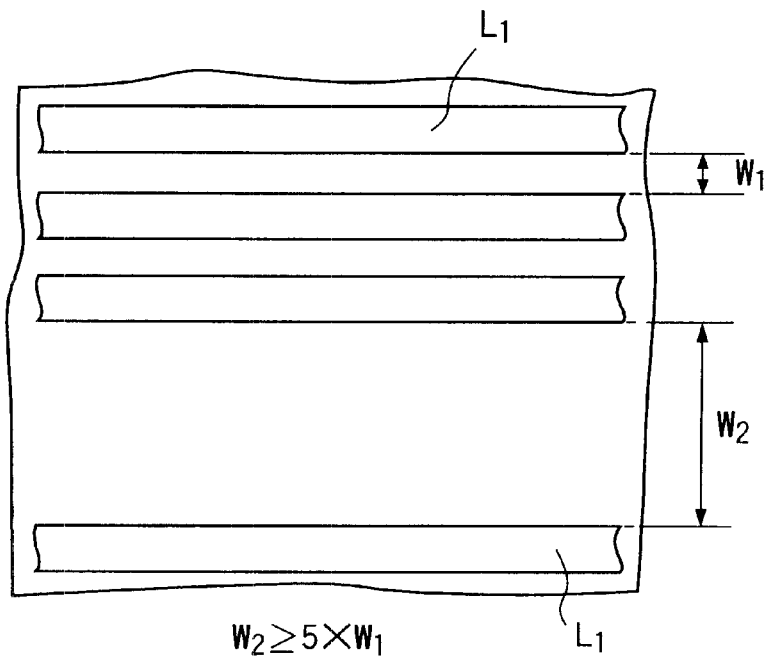
FIG. 13 is a plan view showing a first example of a relationship between a course area of wirings and a close area of wirings.

In other words, as shown in FIG. 13, in the case that a plurality of wirings L1 are aligned on the insulating film, a region where the wirings L1 are aligned at a narrowest wiring interval W1 corresponds to the high density wiring region B, and a region where the wirings L1 are aligned at a narrowest wiring interval W2 which is time times the wiring interval W1 or more corresponds to the low density wiring region A.

Figure 14:
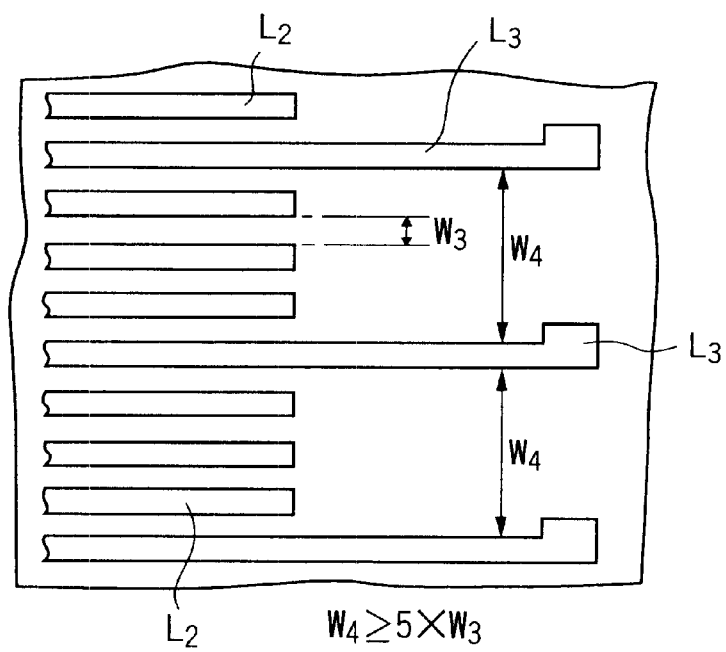
FIG. 14 is a plan view showing a second example of a relationship between a course area of wirings and a close area of wirings.

Also, as shown in FIG. 14, in case a plurality of wirings L2, L3 are aligned at a wiring interval W3 in the high density wiring region B and a part of the wirings L3 extend to the low density wiring region A, a wiring interval W4 in the low density wiring region A is set longer more than five times than the wiring interval W3 in the high density wiring region B.

(Fourth Embodiment)

The above embodiments mainly disclose the wiring structure in the peripheral region of the semiconductor device, but a wiring structure in the device region of the semiconductor device will be explained in this embodiment.

Figure 15:
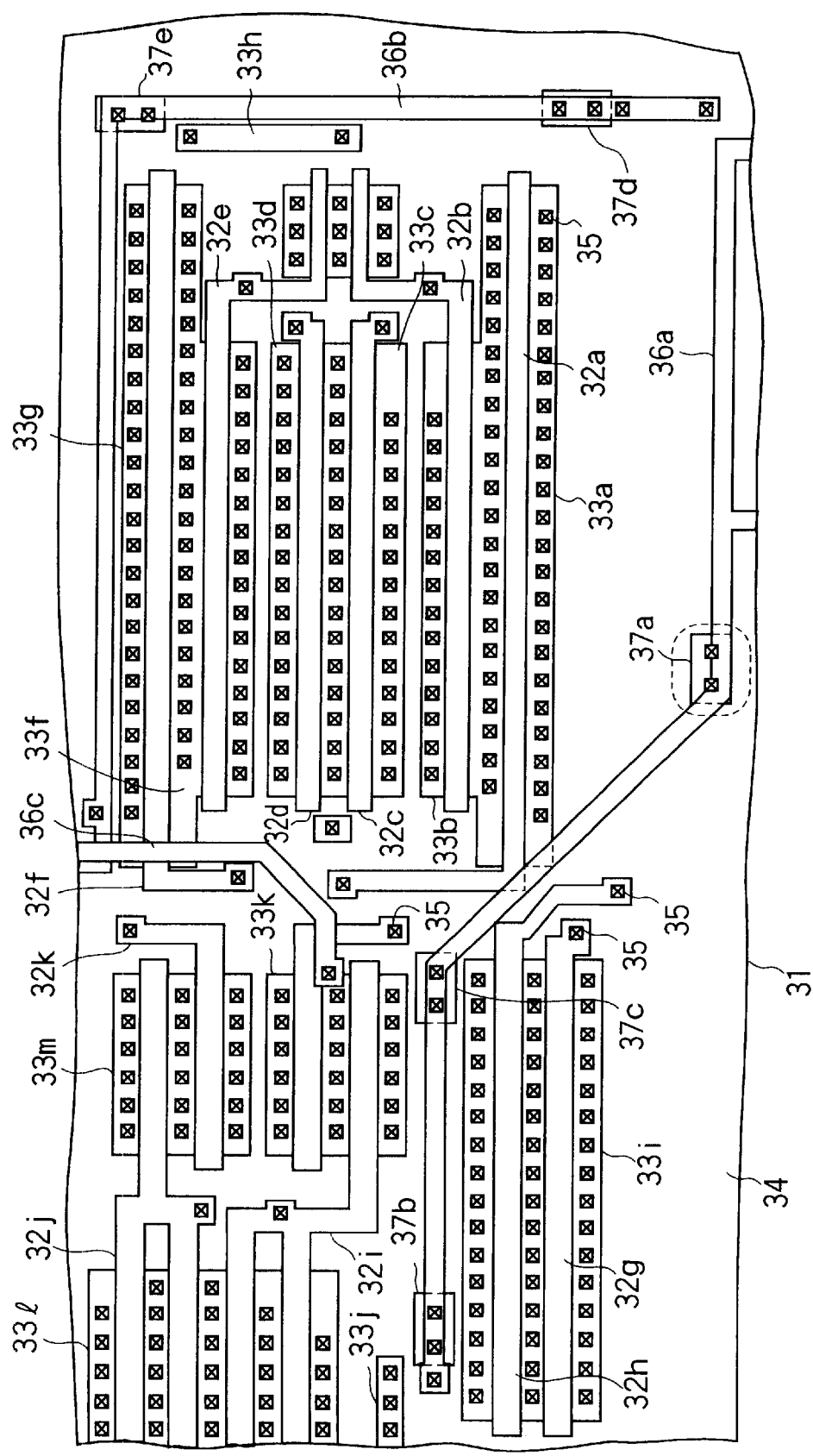
FIG. 15 is a plan view showing a semiconductor device according to a fourth embodiment of the present invention.

FIG. 15 is a plan view showing a device region of a semiconductor device according to a fourth embodiment of the present invention. FIG. 15 is a plan view showing a positional relationship between the wirings and the impurity diffusion layer, and thus all interlayer insulating films are omitted.

In FIG. 15, a plurality of gate wirings 32a to 32k made of first polysilicon are formed on a silicon substrate 31 via gate insulating film (not shown). Also, impurity diffusion layers 33a to 33m are formed in the silicon substrate 31 on both sides of the gate wirings 32a to 32k. A LOCOS film 34 is formed on a surface of the silicon substrate 31 to surround the impurity diffusion layers 33a to 33m.

The gate wirings 32a to 32k and the impurity diffusion layers 33a to 33m are covered with the first interlayer insulating film described later. Second-layer wirings 36a to 36c are formed on the first interlayer insulating film.

Contact regions 35 are arranged in a part of the gate wirings 32a to 32k and a part of the impurity diffusion layers 33a to 33m. Contact holes which are formed in the first interlayer insulating film are arranged over the contact regions 35.

Dummy patterns 37a to 37d, as shown in the above embodiments, are formed on the LOCOS film 34 and under the second-layer wirings 36a to 36c. Like the gate wirings 32a to 32k, the dummy patterns 37a to 37d are formed of the first polysilicon. The dummy patterns 37a to 37d are mainly arranged under bent portions and end portions of the second-layer wirings 36a to 36c.

Next, steps of connecting the dummy pattern 37a and the second-layer wiring 36a and the third-layer wiring in the region enclosed by a broken line in FIG. 15 will be explained hereunder.

Figure 16A:
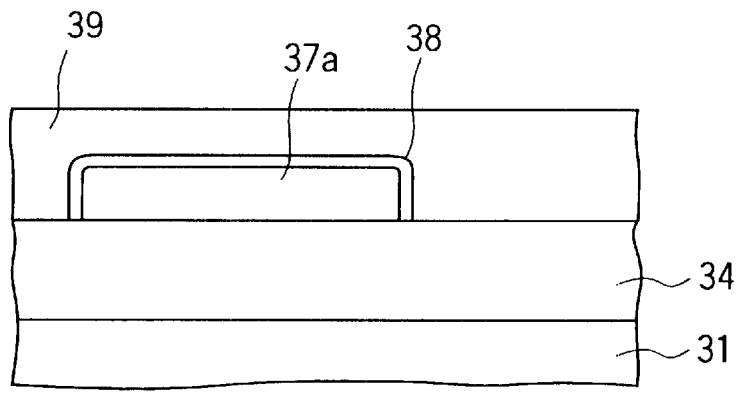
FIGS. 16A to 16E are sectional views showing the steps of manufacturing the semiconductor device according to the fourth embodiment of the present invention.

First, as shown in FIG. 16A, the dummy pattern 37a made of first polysilicon is formed on the LOCOS film 34 which is formed on the surface of the silicon substrate 31. Then, a first $SiO_2$ film 38 is formed by oxidizing the surface of the dummy pattern 37a.

Then, a first interlayer insulating film 39 made of BPSG is formed on the LOCOS film 34 and the dummy pattern 37a. The good contact between the first interlayer insulating film 39 and the dummy pattern 37a can be maintained by the first $SiO_2$ film 38.

Thereafter, the first interlayer insulating film 39 is heated at the temperature of 750° C. to 900° C. to reflow, and then the surface is planarized by the chemical mechanical polishing method.

Figure 16B:
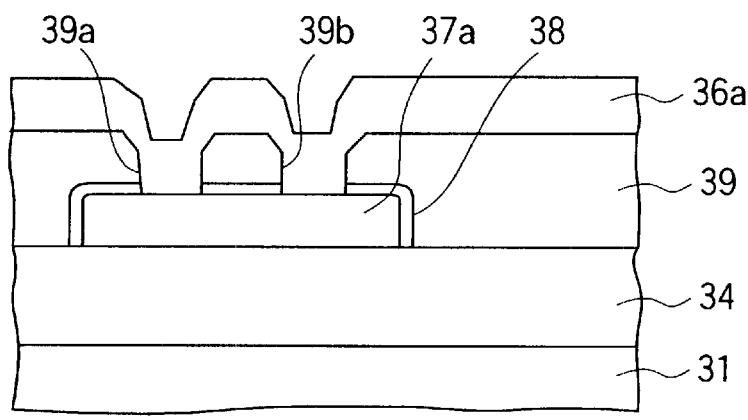

Then, as shown in FIG. 16B, the holes 39a, 39b are formed at two locations on the dummy pattern 37a by patterning the first interlayer insulating film 39 and the first $SiO_2$ film 38 by virtue of the photolithography. After this, the second-layer wiring 36a which is connected to the dummy pattern 37a via the holes 39a, 39b and is formed of the second polysilicon is formed on the first interlayer insulating film 39.

Figure 16C:
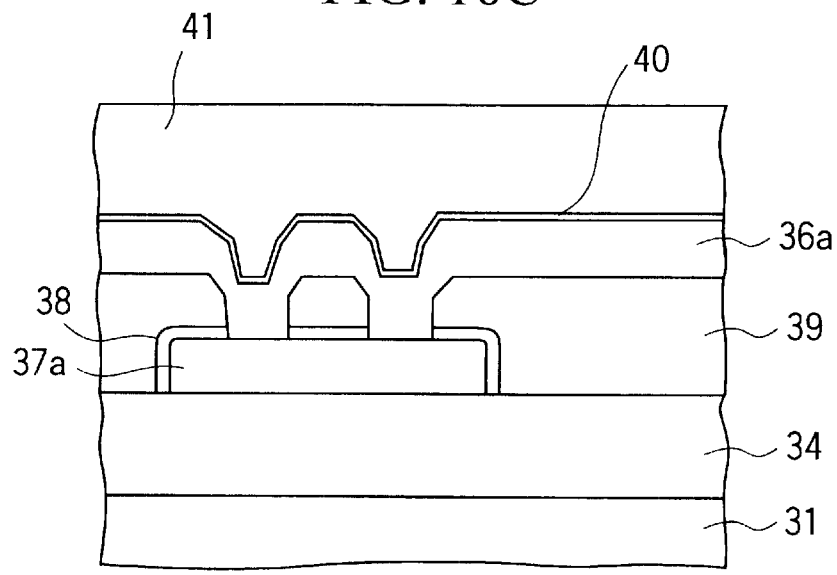

Then, as shown in FIG. 16C, the second $SiO_2$ film 40 is formed by oxidizing the surface of the second-layer wiring 36a. Then, the second interlayer insulating film 41 made of BPSG is formed to cover the second-layer wiring 36a, the first interlayer insulating film 39, etc.

The second interlayer insulating film 41 is heated at the temperature of 750° C. to 900° C. to reflow. At that time, the reflow of the first interlayer insulating film 39 is also caused, but the movement of the first interlayer insulating film 39 can be suppressed since the second-layer wiring 36a is connected to the dummy pattern 37a.

Figure 16D:
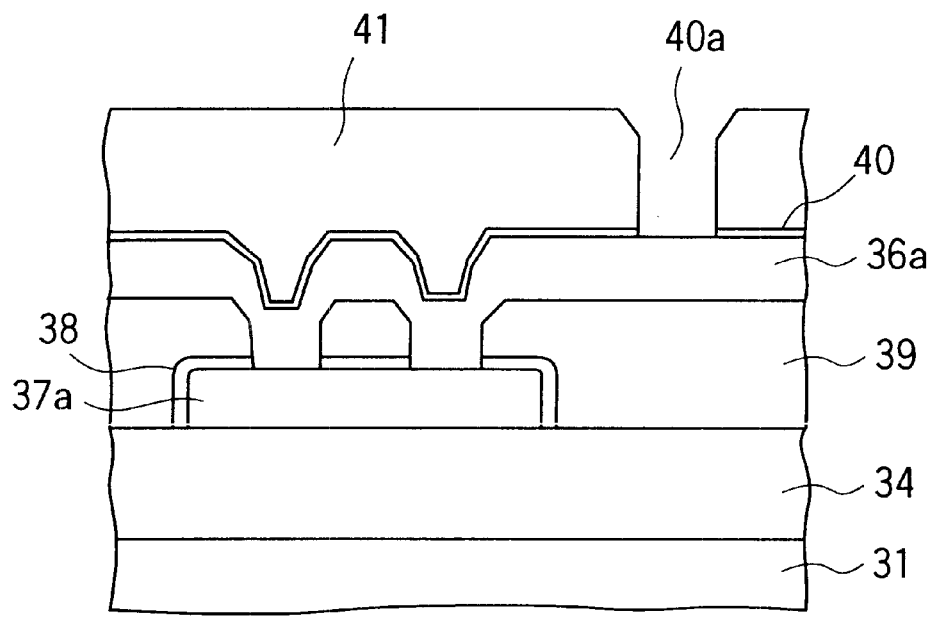

Thereafter, as shown in FIG. 16D, a via hole 41a is formed in the second interlayer insulating film 41 on the second-layer wiring 36a.

Figure 16E:
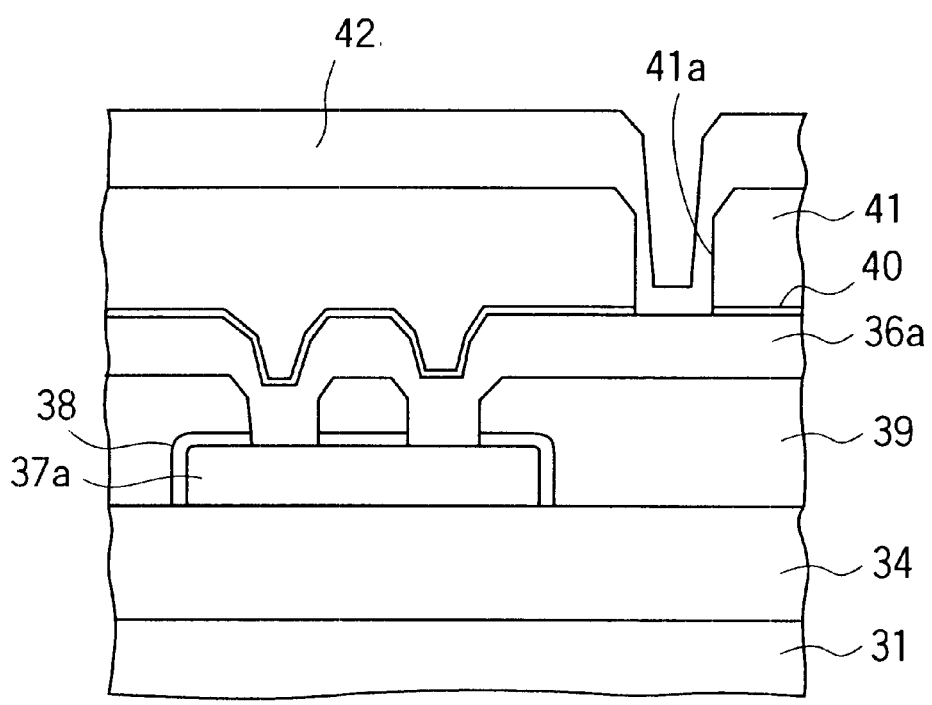

Then, as shown in FIG. 16E, the third-layer wiring 42 which is made of metal being connected to the second-layer wiring 36a via the via hole 41a is formed on the second interlayer insulating film 41.

According to the fourth embodiment, since the dummy patterns are provided under the portions, which are not connected to the underlying patterns over a long distance, and the bent portions of the second-layer wiring and then the dummy patterns and the second-layer wiring are connected, the movement of the second-layer wiring can be prevented at the time of reflow of the second interlayer insulating film. As a result, the movement of the connected portions between the second-layer wiring and the third-layer wiring can be prevented and also the situation that the second-layer wiring is connected to another contact hole can be prevented.

(Fifth Embodiment)

In this embodiment, to prevent movement of displacemenrt check marks and alignment marks will be explained hereunder.

Figure 17:
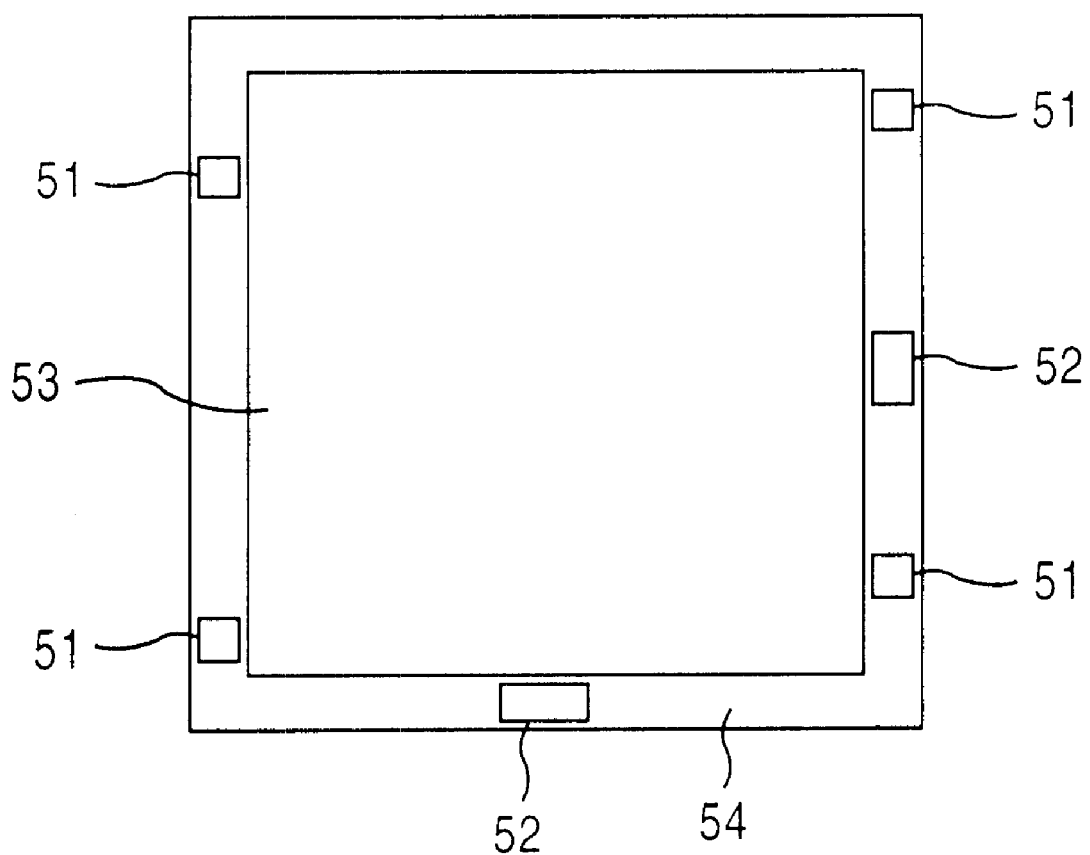
FIG. 17 is a plan view showing alignment of marks employed in the steps of manufacturing the semiconductor device according to a fifth embodiment of the present invention.

FIG. 17 is a plan view showing arranged region in which the displacement check marks and the alignment marks are placed.

In FIG. 17, the displacement check marks 51 and the alignment marks 52 are formed on a scribe line 54 around a device forming region 53. Since these marks 51, 52 are formed on the interlayer insulating film on which the bit lines, for example, are also formed, in some cases they are moved at the time of the reflow of the overlying interlayer insulating film.

Therefore, the movement of these marks 51, 52 is limited by the steps shown in FIGS. 18A to 18E.

Figure 18A:
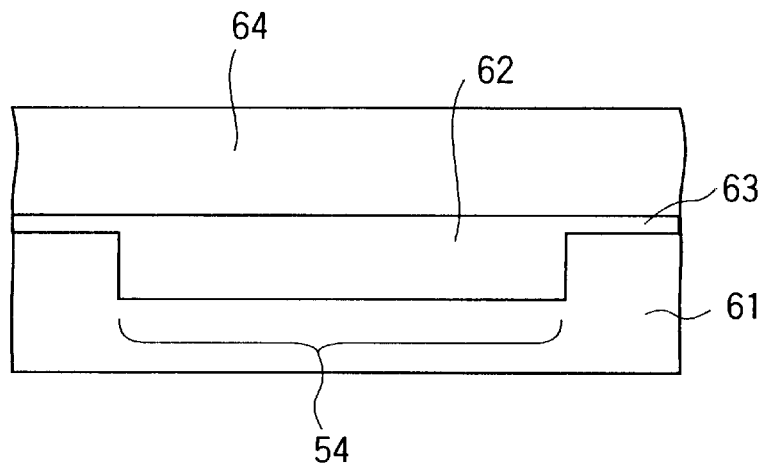
FIGS. 18A to 18E are sectional views showing the steps of manufacturing the semiconductor device according to the fifth embodiment of the present invention.

To begin with, as shown in FIG. 18A, a trench isolation 62 made of $SiO_2$ is formed in a silicon substrate 61, which is covered with a LOCOS film 63, along the scribing line 52.

Then, a first interlayer insulating film 64 made of BPSG is formed on the LOCOS film 63 and the trench isolation 62. Then, the first interlayer insulating film 64 is heated at the temperature of 750° C. to 900° C., e.g., 800° C. for 20 minutes to reflow. Then, the upper surface of the first interlayer insulating film 64 is planarized by the polishing.

Figure 18B:
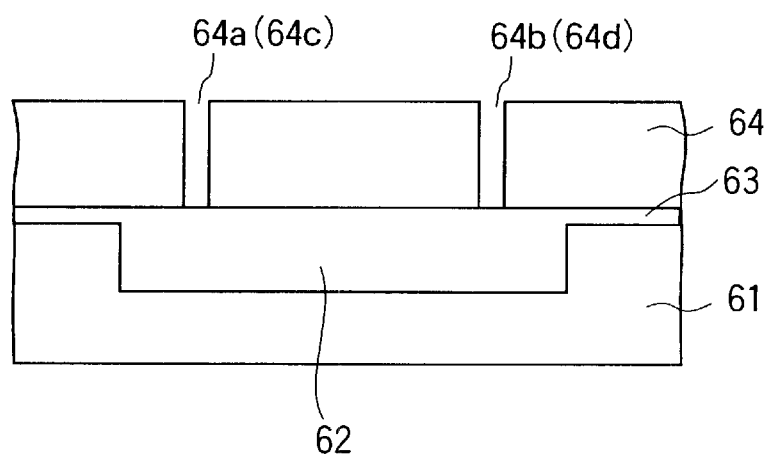

Then, as shown in FIG. 18B, holes 64a to 64d are formed at four corners of the region, in which the displacement check marks 51 and the alignment marks 52 are formed, by patterning the first interlayer insulating film 64 by virtue of the photolithography method.

Figure 18C:
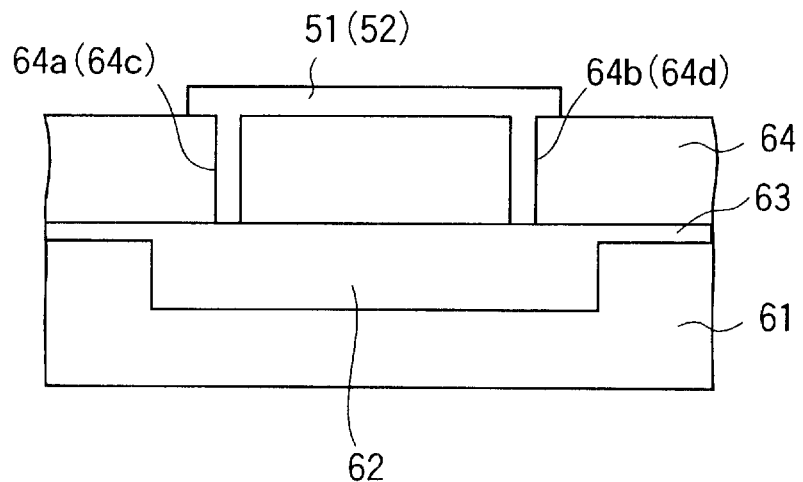

Then, a titanium (Ti) film of 20 nm thick, a titanium nitride (TiN) film of 50 nm thick, and a tungsten (W) film of 100 nm thick are formed in sequence on the first interlayer insulating film 64 and in the holes 64a to 64d. Then, a silicon nitride film of 30 nm thick is formed by the plasma CVD method on the tungsten film as the reflection preventing film. Then, as shown in FIG. 18C, the displacement check marks 51 and the alignment marks 52 which are connected to the trench isolation 62 via the holes 64a to 64d are formed on the first interlayer insulating film 64 by patterning these films by using the photolithography method.

Figure 18D:
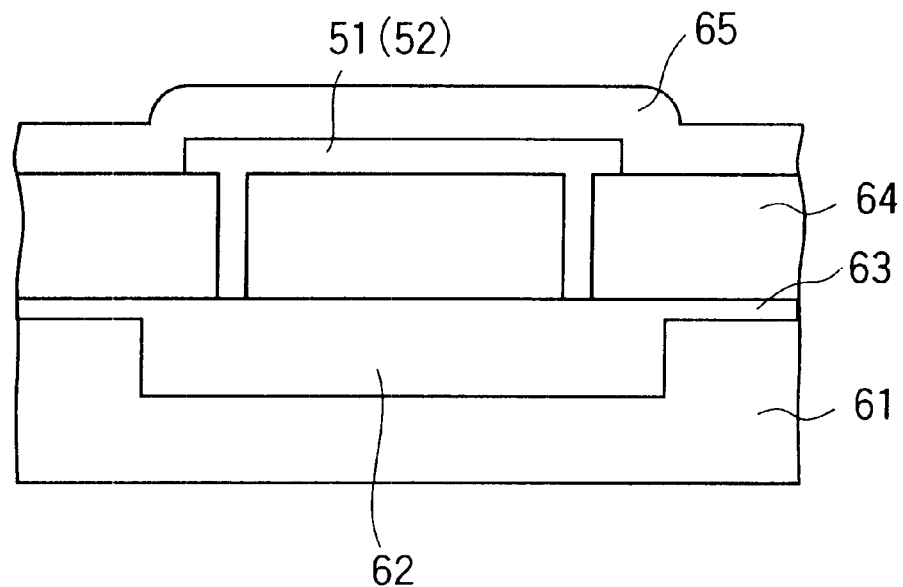
Figure 18E:
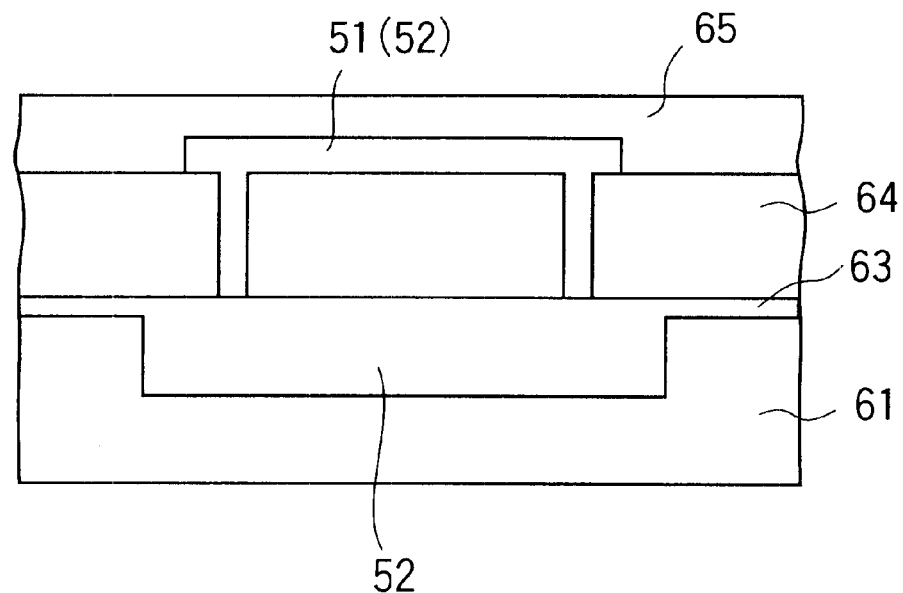

Then, as shown in FIG. 18D, a second interlayer insulating film 65 made of BPSG to cover the displacement check marks 51 and the alignment marks 52 is formed. Then, as shown in FIG. 18E, the second interlayer insulating film is heated at the temperature of 750° C. to 900° C., e.g., about 800° C. for 20 minutes to reflow. At that time, the reflow of the first interlayer insulating film 64 is caused, but the displacement check marks 51 and the alignment marks 52 on the first interlayer insulating film 64 are never moved since they are connected to the trench isolation 62 via the holes 64a to 64d.

Figure 19:
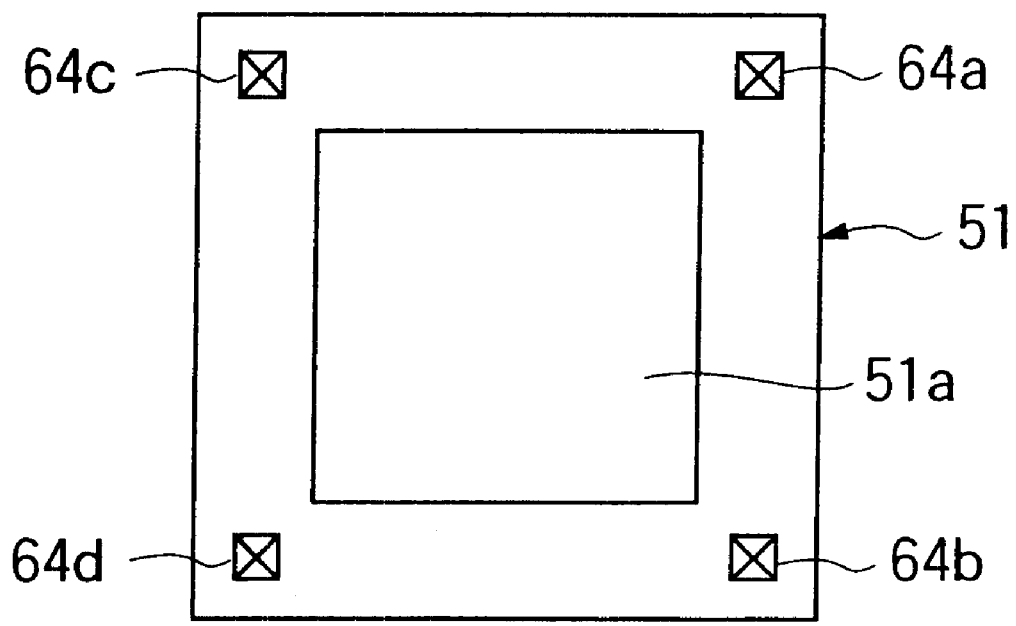
FIG. 19 is a plan view showing displacement test marks employed in manufacturing the semiconductor device according to the fifth embodiment of the present invention.
Figure 20:
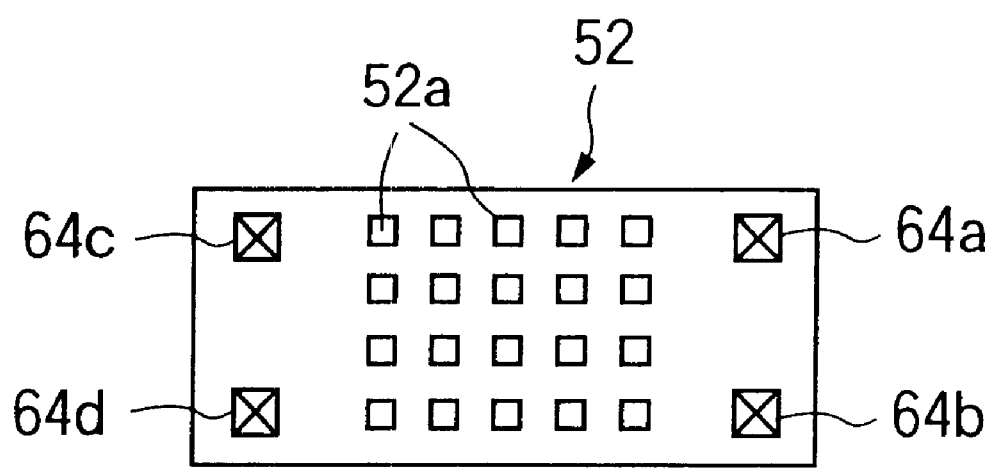
FIG. 20 is a plan view showing alignment marks employed in manufacturing the semiconductor device according to the fifth embodiment of the present invention.

The planar shape of the displacement check mark 51 described above is shown in FIG. 19. A size of the planar shape is 28 μm×28 μm and an opening portion 51a is formed in the center region. The planar shape of the alignment mark 52 is shown in FIG. 20. A size of the planar shape is 70 μm×140 μm and a plurality of opening portions 52a are formed in the center region.

In FIGS. 17 and 18A to 18E, the marks 51, 52 are connected to the trench isolation. The movement of these marks 51, 52 can be prevented if such a structure that they are connected directly to the silicon substrate 61 is employed.

In the above first to fifth embodiments, BPSG is employed as the interlayer insulating film. However, flowable insulating material such as PSG, BSG, $SiO_2$, and others may be utilized as the interlayer insulating film.

The above semiconductor device comprises the first insulating film formed on the semiconductor substrate, the first wiring or mark formed on the first insulating film, the electrically isolated pattern region formed under the first insulating film and below the first wiring or mark, holes formed in the first insulating film to connect the first wiring or mark and the pattern region, and the second insulating film for covering the first wiring or mark.

In the semiconductor device, the pattern region is formed of semiconductor, insulating material, or conductive material. Also, the holes may be formed below the bent portions of the first wiring. In addition, the holes may be formed in the low density wiring region of the region in which the first wiring is formed.

The semiconductor device manufacturing method as described above comprises the steps of forming the electrically isolated pattern region on the semiconductor substrate, forming the first insulating film covering the pattern region, causing reflow of the first insulating film by heating, forming the holes in the first insulating film on the pattern region, forming the wiring or the mark passing through the holes on the first insulating film, and forming the second insulating film on the wiring or the mark.

In the semiconductor device manufacturing method, the pattern region is formed of the pattern of the semiconductor film, the insulating material, or the conductive material. In this case, the conductive film may be formed by introducing the impurity into the semiconductor substrate. Also, the pattern region may be formed by the same steps as those applied to the wiring formed under the first insulating film. In addition, the holes may be formed under the bent portion of the wiring.

As described above, according to the present invention, in the location where the wiring is not connected to the underlying wiring or the active region over the long distance, the location where the wiring is bent, the location where the wirings are formed coarsely, the location where the wiring is easily moved, or the like, the wiring formed on the interlayer insulating film is connected to the electrically isolated pattern region via the underlying holes. Therefore, if the reflow of the interlayer insulating film is caused, the movement of the wiring can be suppressed by the isolated pattern region, so that the defective contact and the short-circuit between the wirings due to the movement of the wiring can be prevented.

What is claimed is:

1. A semiconductor device comprising:
   a semiconductor substrate including a transistor;
   a first insulating film formed on or above the semiconductor substrate;
   a first wiring or mark formed on the first insulating film;
   a pattern not being electrically connected to the transistor, the pattern formed under the first insulating film and below the first wiring or mark;
   a hole formed in the first insulating film to connect the first wiring or mark to the pattern not being electrically connected to the transistor; and
   a second insulating film for covering the first wiring or mark.

2. A semiconductor device according to claim 1, wherein the hole is formed below a bent portion of the first wiring.

3. A semiconductor device according to claim 1, wherein the hole is formed in a low density wiring region of a region in which the first wiring is formed.

4. A semiconductor device according to claim 1, wherein a second wiring contacting the first wiring through a second hole in the second insulating film is formed on the second insulating film.

5. A semiconductor device according to claim 1, wherein the electrically isolated pattern is a semiconductor pattern, an insulating pattern, or a conductive pattern.

6. A semiconductor device according to claim 1, wherein the electrically isolated pattern is a LOCOS film formed on the semiconductor substrate, or a trench isolation formed in the semiconductor substrate.

7. A semiconductor device according to claim 1, wherein the mark is a displacement check mark or an alignment mark.

8. A semiconductor device according to claim 7, wherein the displacement check mark or the alignment mark is formed on or above a scribe line of the semiconductor substrate.

9. A semiconductor device according to claim 1, wherein the pattern not being electrically connected to the transistor is a member selected from the group consisting of an insulating pattern, a semiconductor pattern and a conductive pattern, the semiconductor pattern and the conductive pattern being not electrically connected to any one of another semiconductor pattern and another conductive pattern.

* * * * *